(12) United States Patent
Raj

(10) Patent No.: US 7,440,304 B1
(45) Date of Patent: Oct. 21, 2008

(54) MULTIPLE STRING SEARCHING USING TERNARY CONTENT ADDRESSABLE MEMORY

(75) Inventor: Sunder Rathnavelu Raj, Marlboro, NJ (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/780,391

(22) Filed: Jul. 19, 2007

Related U.S. Application Data

(62) Division of application No. 10/700,722, filed on Nov. 3, 2003.

(51) Int. Cl.
G11C 15/00 (2006.01)

(52) U.S. Cl. ............ 365/49.1; 365/189.06; 365/189.07; 365/230.06; 365/233

(58) Field of Classification Search ................ 365/49.1, 365/189.06, 189.07, 230.06, 233
See application file for complete search history.

(56) References Cited

U.S. PATENT DOCUMENTS

| | | | |
|---|---|---|---|
| 5,051,886 A | 9/1991 | Kawaguchi et al. | |
| 5,151,697 A | 9/1992 | Bunton | |
| 5,278,981 A | 1/1994 | Kawaguchi et al. | |
| 5,386,413 A | 1/1995 | McAuley et al. | |
| 5,414,704 A | 5/1995 | Spinney | |
| 5,440,715 A | 8/1995 | Wyland | |
| 5,440,753 A | 8/1995 | Hou et al. | |
| 5,452,451 A | 9/1995 | Akizawa et al. | |
| 5,469,161 A | 11/1995 | Bezek | |
| 5,497,488 A | 3/1996 | Akizawa et al. | |
| 5,615,378 A | 3/1997 | Nishino et al. | |
| 5,712,971 A | 1/1998 | Stanfill et al. | |
| 5,781,431 A | 7/1998 | Duret et al. | |
| 5,963,942 A | 10/1999 | Igata | |
| 5,995,963 A | 11/1999 | Nanba et al. | |
| 5,999,435 A * | 12/1999 | Henderson et al. ....... | 365/49.17 |
| 6,011,795 A | 1/2000 | Varghese et al. | |
| 6,018,524 A | 1/2000 | Turner et al. | |
| 6,067,574 A | 5/2000 | Tzeng | |
| 6,115,716 A | 9/2000 | Tikkanen et al. | |

(Continued)

FOREIGN PATENT DOCUMENTS

EP 0408188 A2 1/1991

OTHER PUBLICATIONS

"Fast Routing Table Lookup Using CAMs", Anthony J. McAuley and Paul Francis, 1993, pp. 1382-1391, IEEE.
"Memory Organization Scheme for the Implementation of Routing Tables in High Performance IP Routers", document dated Nov. 21, 2003, 6 pages.

(Continued)

*Primary Examiner*—Pho M. Luu
(74) *Attorney, Agent, or Firm*—William L. Paradice, III

(57) ABSTRACT

A method and apparatus for multiple string searching using a ternary content addressable memory. The method includes receiving a text string having a plurality of characters and performing an unanchored search of a database of a stored patterns matching one or more characters of the text string using a state machine, wherein the state machine comprises a ternary content addressable memory (CAM) and wherein the performing comprises comparing a state and one of the plurality of characters with contents of a state field and a character field, respectively, stored in the ternary CAM. In various embodiments, one or more of the following search features may be supported: exact string matching, inexact string matching, single character wildcard matching, multiple character wildcard matching, case insensitive matching, parallel matching and rollback.

27 Claims, 26 Drawing Sheets

U.S. PATENT DOCUMENTS

| | | | |
|---|---|---|---|
| 6,185,524 | B1 | 2/2001 | Carus et al. |
| 6,311,183 | B1 | 10/2001 | Cohen |
| 6,377,942 | B1 | 4/2002 | Hinsley et al. |
| 6,421,660 | B1 | 7/2002 | Glaise |
| 6,425,099 | B1 | 7/2002 | Lattmann et al. |
| 6,487,566 | B1 | 11/2002 | Sundaresan |
| 6,505,206 | B1 | 1/2003 | Tikkanen et al. |
| 6,538,911 | B1 * | 3/2003 | Allan et al. ............. 365/49.1 |
| 6,546,391 | B1 | 4/2003 | Tsuruoka |
| 6,560,610 | B1 | 5/2003 | Eatherton et al. |
| 6,785,677 | B1 | 8/2004 | Fritchman |
| 7,134,143 | B2 | 11/2006 | Stellenberg et al. |
| 7,225,188 | B1 | 5/2007 | Gai et al. |
| 2003/0041163 | A1 | 2/2003 | Rhoades et al. |
| 2003/0048785 | A1 | 3/2003 | Calvignac et al. |
| 2003/0065774 | A1 | 4/2003 | Steiner et al. |
| 2004/0177319 | A1 | 9/2004 | Horn |
| 2006/0259508 | A1 | 11/2006 | Sikdar et al. |

OTHER PUBLICATIONS

A Search Algorithm for Table Entries with Non-Contiguous Wildcarding, Paul F. Tsuchiya, Bellcore, 1991, pp. 1-10.

A Tree-Based Packet Routing Table for Berkeley Unix, Keith Sklower, Berkeley Technical Report, UC Berkeley, CA, USA, 1991, pp. 1-14.

Efficient String Matching: An Aid to Bibliographic Search, Aho, A. V. and Corasick, M. J., Communications of the Association of Computing Machinery (ACM) Jun. 1975, vol. 18, No. 6. pp. 333-340.

International Searching Authority, International Search Report for PCT/US03/26486, Feb. 4, 2004.

Masaki Hirata et al, "A Versatile Data String-Search VLSI," Apr. 1988, IEEE vol. 23, No. 2, pp. 329-335.

Over 10Gbps String Matching Mechanism for Multi-stream Packet Scanning Systems, Yutaka Sugawara, Mary Inaba, and Kei Hiraki, FPL 2004, LNCS 3203, pp. 484-493, 2004, J. Becker, M. Platzner, S. Vernalde, Editors.

Putting Routing Tables in Silicon, Tong-Bi Pei and Charles Zukowski, IEEE Network Magazine, Jan. 1992, vol. 6, No. 1, pp. 42-50.

VLSI Implementation of Routing Tables: Tries and CAMs, Tong-Bi Pei and Charles Zukowski, 1991 IEEE Infocom'91, Proceedings vol. 2, pp. 515-524.

* cited by examiner

| Address | STATE | CHAR | NXT_STATE | ACTION | RESULT |
|---|---|---|---|---|---|
| | | | "goto" transitions | | |
| 0 | IDLE | H | H | NOP | 0 |
| 1 | IDLE | S | S | NOP | 0 |
| 2 | H | E | HE | Output Result | 1 |
| 3 | HE | R | HER | NOP | 0 |
| 4 | HER | S | HERS | Output Result | 2 |
| 5 | H | I | HI | NOP | 0 |
| 6 | HI | S | HIS | Output Result | 3 |
| 7 | S | H | SH | NOP | 0 |
| 8 | SH | E | SHE | Output Result | 4 |
| | | | Failure transitions | | |
| 9 | H | * | IDLE 471 | Failure | 0 |
| 10 | HE | * | IDLE 472 | Failure | 0 |
| 11 | S | * | IDLE 473 | Failure | 0 |
| 12 | SH | * | H | Failure | 0 |
| 13 | SHE | * | HE | Failure | 0 |
| 14 | HIS | * | S | Failure | 0 |
| 15 | HER | * | IDLE 474 | Failure | 0 |
| 16 | HERS | * | S | Failure | 0 |

GOTO BLOCK 491 (addresses 0–8)
FAILURE BLOCK 492 (addresses 9–16)
TCAM 220 — Associated Memory 230
PATTERN AND STRING DATABASE 215

FIG. 4B

| Address | STATE 351 | CHAR 352 | NXT_STATE 353 | ACTION 354 | RESULT 355 |
|---|---|---|---|---|---|
| 0 | IDLE | H | H | NOP | 0 |
| 1 | IDLE | S | S | NOP | 0 |
| 2 | H | E | HE | Output Result | 1 |
| 3 | HE | R | HER | NOP | 0 |
| 4 | HER | S | HERS | Output Result | 2 |
| 5 | H | I | HI | NOP | 0 |
| 6 | HI | S | HIS | Output Result | 3 |
| 7 | S | H | SH | NOP | 0 |
| 8 | SH | E | SHE | Output Result | 4 |
| 12 | SH | * | H | Failure | 0 |
| 13 | SHE | * | HE | Failure | 0 |
| 14 | HIS | * | S | Failure | 0 |
| 16 | HERS | * | S | Failure | 0 |
|  | ** | * | IDLE 475 | Failure | 0 |

"goto" transitions (rows 0–8, GOTO BLOCK 491)
Failure transitions (rows 12–16, FAILURE BLOCK 492)

TCAM 220 ←———→ Associated Memory 230

PATTERN AND STRING DATABASE 215

FIG. 4C

|   | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | NUL | SOH | STX | ETX | EOT | ENQ | ACK | BEL | BS | TAB | LF | VT | FF | CR | SO | SI |
| 1 | DLE | DC1 | DC2 | DC3 | DC4 | NAK | SYN | ETB | CAN | EM | SUB | ESC | E3 | GS | RS | US |
| 2 |   | ! | " | # | $ | % | & | ' | ( | ) | * | + | , | - | . | / |
| 3 | 0 | 1 | 2 | 3 | 4 | 5 | 6 | 7 | 8 | 9 | : | ; | < | = | > | ? |
| 4 | @ | A | B | C | D | E | F | G | H | I | J | K | L | M | N | O |
| 5 | P | Q | R | S | T | U | V | W | X | Y | Z | [ | \ | ] | ^ | _ |
| 6 | ` | a | b | c | d | e | f | g | h | i | j | k | l | m | n | o |
| 7 | p | q | r | s | t | u | v | w | x | y | z | { | | | } | ~ |   |

FIG. 7A

| Address | STATE 351 | CHAR 352 | PREV_RSLT 856 | NXT_STATE 353 | RSLT 355 | ACTION 354 |
|---|---|---|---|---|---|---|
| 0 | IDLE | T | * | IDLE | 101 | UPDATE CUR_PREFIX |
| 1 | IDLE | B | * | B | 0 | NOP |
| 2 | B | L | * | BL | 0 | NOP |
| 3 | BL | E | 101 | IDLE | 102 | OUTPUT WILD CARD MATCH |

← TCAM 220 → ← ASSOCIATED MEM 230 →

FIG. 8C

| Address | STATE | CHAR | PREV_RSLT | COUNT | NXT_STATE | RSLT | ACTION |
|---|---|---|---|---|---|---|---|
| 0 | IDLE | T | * | 0 | IDLE | 101 | UPDATE CUR_PREFIX |
| 1 | IDLE | B | * | * | B | 0 | NOP |
| 2 | B | L | * | * | BL | 0 | NOP |
| 3 | BL | E | 101 | 5 | IDLE | 102 | OUTPUT WILD CARD MATCH |

351 — STATE
352 — CHAR
856 — PREV_RSLT
857 — COUNT
353 — NXT_STATE
355 — RSLT
354 — ACTION

TCAM 220
ASSOCIATED MEM 230

FIG. 8D

| Address | STATE | CHAR | PREV_RSLT | NXT_STATE | RSLT | ACTION |
|---|---|---|---|---|---|---|
| 0 | IDLE | S | * | IDLE | 102 | UPDATE CUR_PREFIX |
| 1 | IDLE | T | * | IDLE | 101 | UPDATE CUR_PREFIX |
| 2 | IDLE | B | * | B | 0 | NOP |
| 3 | B | L | * | BL | | NOP |
| 4 | BL | E | 101 | IDLE | 103 | OUTPUT FIRST WILD CARD MATCH |
| 5 | BL | E | 102 | IDLE | 104 | OUTPUT SECOND WILD CARD MATCH |

FIG. 8E

| Address | STATE | CHARS | NXT_STATE | RSLT | ACTION |
|---|---|---|---|---|---|
| 0 | COMM | UNIC | COMMUNIC | 0 | NOP |
| 1 | COMMUNIC | ATIO | COMMUNICATIO | 0 | NOP |
| 2 | COMMUNICATIO | NSCO | CO | 102 | Output Result |
| 3 | COM | MUNI | COMMUNI | 0 | NOP |
| 4 | COMMUNI | CATI | COMMUNICATI | 0 | NOP |
| 5 | COMMUNICATI | ONSC | C | 102 | Output Result |
| 6 | CO | MMUN | COMMUN | 0 | NOP |
| 7 | COMMUN | ICAT | COMMUNICAT | 0 | NOP |
| 8 | COMMUNICATION | SCOM | COM | 102 | Output Result |
| 9 | C | OMMU | COMMU | 0 | NOP |
| 10 | COMMU | NICA | COMMUNICA | 0 | NOP |
| 11 | COMMUNICA | TION | COMMUNICATION | 0 | NOP |
| 12 | COMMUNICAT | IONS | IDLE | 102 | Output Result |
| 13 | COMMUNICATIO | NS** | IDLE | 102 | Output Result |
| 14 | COMMUNICATI | ONS* | IDLE | 102 | Output Result |
| 15 | COMMUNICATION | S*** | IDLE | 102 | Output Result |
| 16 | * | COMM | COMM | 0 | NOP |
| 17 | * | *COM | COM | 0 | NOP |
| 18 | * | **CO | CO | 0 | NOP |
| 19 | * | ***C | C | 0 | NOP |
| 20 | * | **** | IDLE | 0 | NOP |

FIG. 9C

| Address | STATE | CHARS | NXT_STATE | ROLLBK | RSLT | ACTION |
|---|---|---|---|---|---|---|
| 0 | COMM | UNI* | COMMUNI | 1 | 0 | NOP |
| 1 | COM | MUNI | COMMUNI | 0 | 0 | NOP |
| 2 | COMMUNI | CATI | COMMUNICATI | 0 | 0 | Output Results |
| 3 | COMMUNICATI | ONS* | IDLE | 1 | 102 | Output Result 102 |
| 4 | CO | MMUN | COMMUN | 0 | 0 | NOP |
| 5 | COMMUN | I*** | COMMUNI | 3 | 0 | NOP |
| 6 | C | OMMU | COMMU | 0 | 0 | NOP |
| 7 | COMMU | NI** | COMMUNI | 2 | 0 | NOP |
| 8 | * | COMM | COMM | 0 | 0 | NOP |
| 9 | * | *COM | COM | 0 | 0 | NOP |
| 10 | * | **CO | CO | 0 | 0 | NOP |
| 11 | * | ***C | C | 0 | 0 | NOP |
| 12 | * | **** | IDLE | 0 | 0 | NOP |

FIG. 10D

MULTIPLE STRING SEARCHING USING TERNARY CONTENT ADDRESSABLE MEMORY

CROSS-REFERENCE TO RELATED APPLICATION

This application is a divisional application and claims the benefit under 35 USC §120 of the co-pending and commonly owned U.S. patent application Ser. No. 10/700,722 entitled "Multiple String Searching Using Content Addressable Memory" filed on Nov. 3, 2003 which is incorporated herein by reference.

FIELD OF INVENTION

This invention relates to the field of string search devices and, in particular, to the use of a content addressable memory device to perform searches for multiple strings.

BACKGROUND

The problem of string searching occurs in many applications. The string search algorithm looks for a string called a "pattern" within a larger input string called the "text." Multiple string searching refers to searching for multiple such patterns in the text string without having to search multiple passes. In a string search, the text string is typically several thousand bits long with the smallest unit being one octet in size. The start of a pattern string within the text is typically not known. A search method that can search for patterns when the start of patterns within the argument text is not known in advance is known as unanchored searching. In an anchored search, the search algorithm is given the text along with information on the offsets for start of the strings.

A generalized multiple string search is utilized in many applications such as URL based switching, Web caching, XML parsing, text compression and decompression, analyzing DNA sequences in the study of genetics and intrusion detection systems for the internet. In string searching applications, an argument text is presented to the string search engine, which then searches this text for the occurrence of each of a multiple patterns residing in a database, as illustrated in FIG. 1. If a match is found, then an index or code that uniquely identifies the matching pattern entry in the database is returned along with a pointer (offset) to the matching position in the input text string. The pointer indicates the number of characters positions that are offset from the starting character of the string for which a matching pattern in the database is found in the input text string.

For example, consider the input text string: "We hold these truths to be self-evident, that all men are created equal, that they are endowed by their Creator with certain unalienable Rights, that among these are Life, Liberty and the pursuit of Happiness." Assume that the pattern "that" is stored in the pattern database as a first pattern (Pattern 1) and the pattern "are" is stored in the pattern database as a second pattern (Pattern 2). For the two pattern strings "that" and "are," a string search engine utilizing a matching algorithm may output a result of Offset-41/Pattern 1 because the pattern "that" was found as a pattern in the database and the first character "t" in the pattern "that" is offset 41 places from the starting character "W" of the input text string. The other results, for example, would be as follows: Offset-54/Pattern 2; Offset-73/Pattern 1; Offset 83/Pattern 2; Offset 145:/Pattern 1; Offset 162/Pattern 2.

Some prior string search engines are based on software algorithms such as Boyer-Moore that are inherently slow and have limited throughput. Other prior string search engines utilize the Aho-Corasick algorithm for string matching in which either a static random access memory (SRAM) or content addressable memory (CAM) based lookup table is used to implement state transitions in the string search engine. One problem with prior string search engines utilizing the Aho-Corasick algorithm, such as disclosed in U.S. Pat. No. 5,278,981, is that that they are incapable of performing wildcard or inexact matching. While some prior methods are capable of performing wildcard matching such as disclosed in U.S. Pat. No. 5,452,451, the inexact matching feature is limited only to prefixes in text strings. Moreover, such prior methods are only capable of anchored searches in which the start of patterns within the incoming text string must be known and identified to the search engine. Further, such prior methods are not capable of case insensitive matching that is required in many applications. In addition, for a given pattern database, such prior methods require a large number of entries in a CAM device. In addition, the prior methods are not capable of increasing the search speed by processing multiple octets from the text string concurrently.

BRIEF DESCRIPTION OF THE DRAWINGS

The present invention is illustrated by way of example and not intended to be limited by the figures of the accompanying drawings.

FIG. 4B illustrates an exemplary implementation of the goto-failure method of FIG. 4A.

FIG. 4C illustrates exemplary contents of one embodiment of a database having compressed entries implementing the goto-failure method of FIG. 4A.

FIG. 7A shows the ASCII encoded character set.

FIG. 8C illustrates an embodiment of exemplary TCAM and associated memory fields implementing wildcard matching.

FIG. 8D illustrates an alternative embodiment of a wildcard matching method with a fixed number of wildcard characters.

FIG. 8E illustrates an alternative embodiment of a wildcard matching method capable of searching for nested wildcard patterns.

FIG. 9C illustrates an exemplary embodiment of TCAM and associated memory fields.

FIG. 10D illustrates an exemplary embodiment of TCAM and associated memory fields for a rollback matching method.

DETAILED DESCRIPTION

Figure 1:
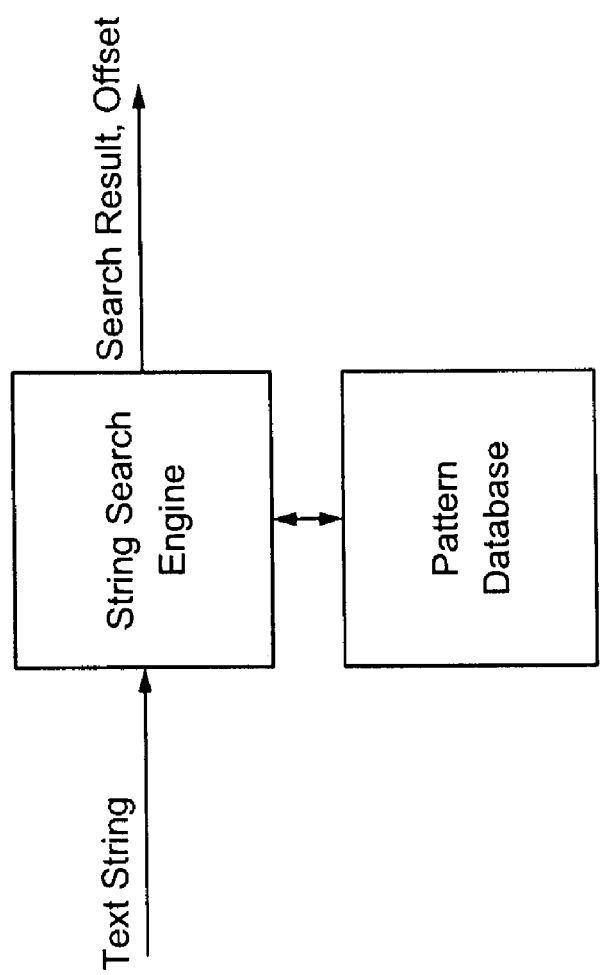
FIG. 1 is a conceptual illustration of string searching.

In the following description, numerous specific details are set forth such as examples of specific, components, circuits, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Embodiments of the present invention include various method steps, which will be described below. The steps may be performed by hardware components or may be embodied in machine-executable instructions, which may be used to cause hardware components (e.g., a processor, programming circuit) programmed with the instructions to perform the steps. Alternatively, the steps may be performed by a combination of hardware and software.

Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

The machine readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

It should be noted that the steps and operations discussed herein (e.g., the loading of registers) may be performed either synchronously or asynchronously. The term "coupled" as used herein means connected directly to or connected through one or more intervening components or circuits. Any of the signals provided over various buses described herein may be time multiplexed with other signals and provided over one or more common buses. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicates that the signal is an active low signal. Each of the active low signals may be changed to active high signals as generally known in the art.

A method and apparatus for text string matching is disclosed. In one embodiment, the method includes receiving a text string having a plurality of characters and using a state machine to perform a search on a database to locate instances of specific pattern strings in the text string. In one embodiment, the state machine includes a ternary CAM search engine. Performing the pattern search may include comparing a state and one of the plurality of characters in the text string with a current state and a current character, respectively, stored in the ternary CAM.

For one embodiment, the state machine looks for occurrence of one or more patterns stored in the database that match one or more characters in the text. If a match is found, then an index that uniquely identifies the matching pattern in the database is returned along with an offset pointer to the matching position in the input text string. The pointer indicates the number of character positions that are offset from the starting character of the string for which a matching pattern in the database is found in the input text string. In one particular embodiment, the string matching apparatus may support the search of text string width's greater than the width of a row of CAM cells in the ternary CAM array.

In various embodiments, one or more of the following database search features may be supported: exact string matching, inexact string matching, single character wildcard matching (e.g., the pattern "Jo?n" where ? represents any single character, with such a pattern capable of matching incoming text string such as "John" "Joan" and "Join" but not "Jon" or "Johan"), multiple character wildcard matching (e.g., the pattern "John had a # day" where # represents 0 or more characters, with such a pattern capable of matching an incoming text string such as "John had a good day" or "John had a AAABBB day"), case insensitive matching, parallel matching and rollback optimization, as discussed in further detail below.

Figure 2A:
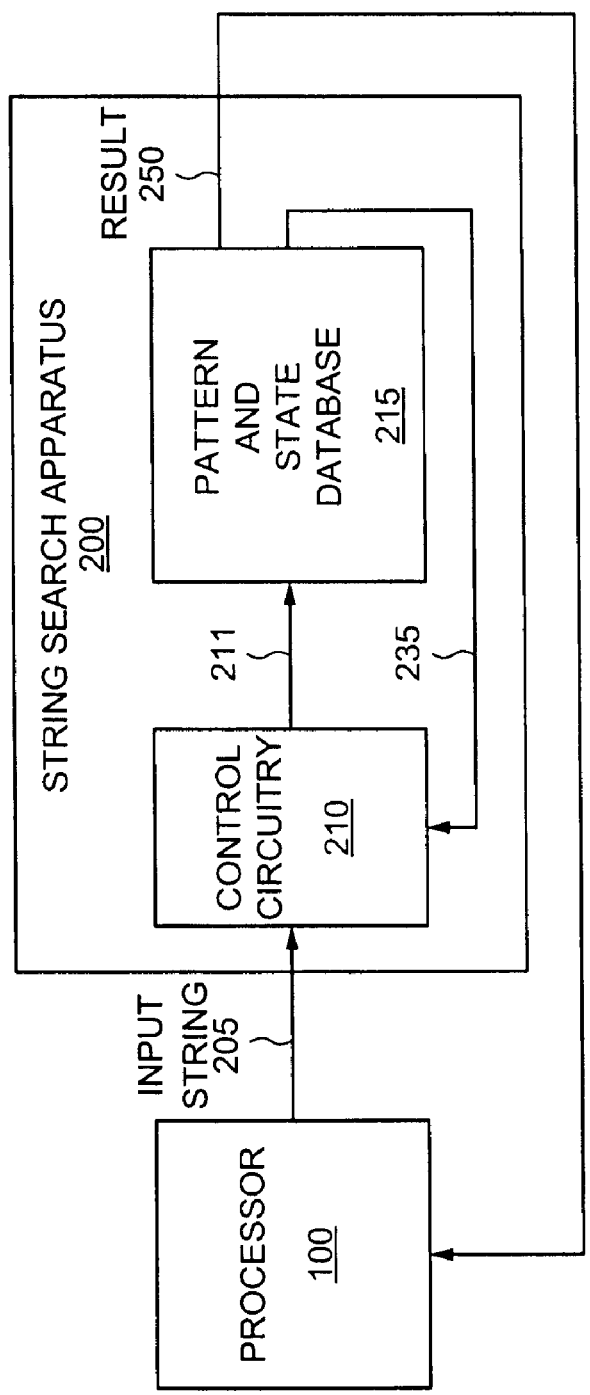
FIG. 2A illustrates one embodiment of a string search apparatus.

FIG. 2A illustrates one embodiment of a string search apparatus. String search apparatus 200 includes control circuitry 210 coupled to pattern and state database 215. Control circuitry 210 is configured to receive an input text string 205 having a plurality of characters from another device such as a processor 100. (e.g., a network processor unit ("NPU"), microprocessor, or other control device including, for example, an Application Specific Integrated Circuit "ASIC" or the like). The control circuitry 210 is coupled to pattern and state database 215 to perform a search of the database for a stored pattern matching one or more characters of the input text string 205. Each character in the input text string may be encoded in one of the many encoding schemes known in the art, such as ASCII or EBSDIC. Typically, each character is encoded into one octet, although other encodings may be used. In one particular embodiment, the control circuitry 210 processes one character from the input text string at a time. Alternatively, control circuitry 210 may processes multiple characters at a time when a higher search rate is required. The multiple characters may be presented to control circuitry 210 at the same time or sequentially in time.

Figure 2B:
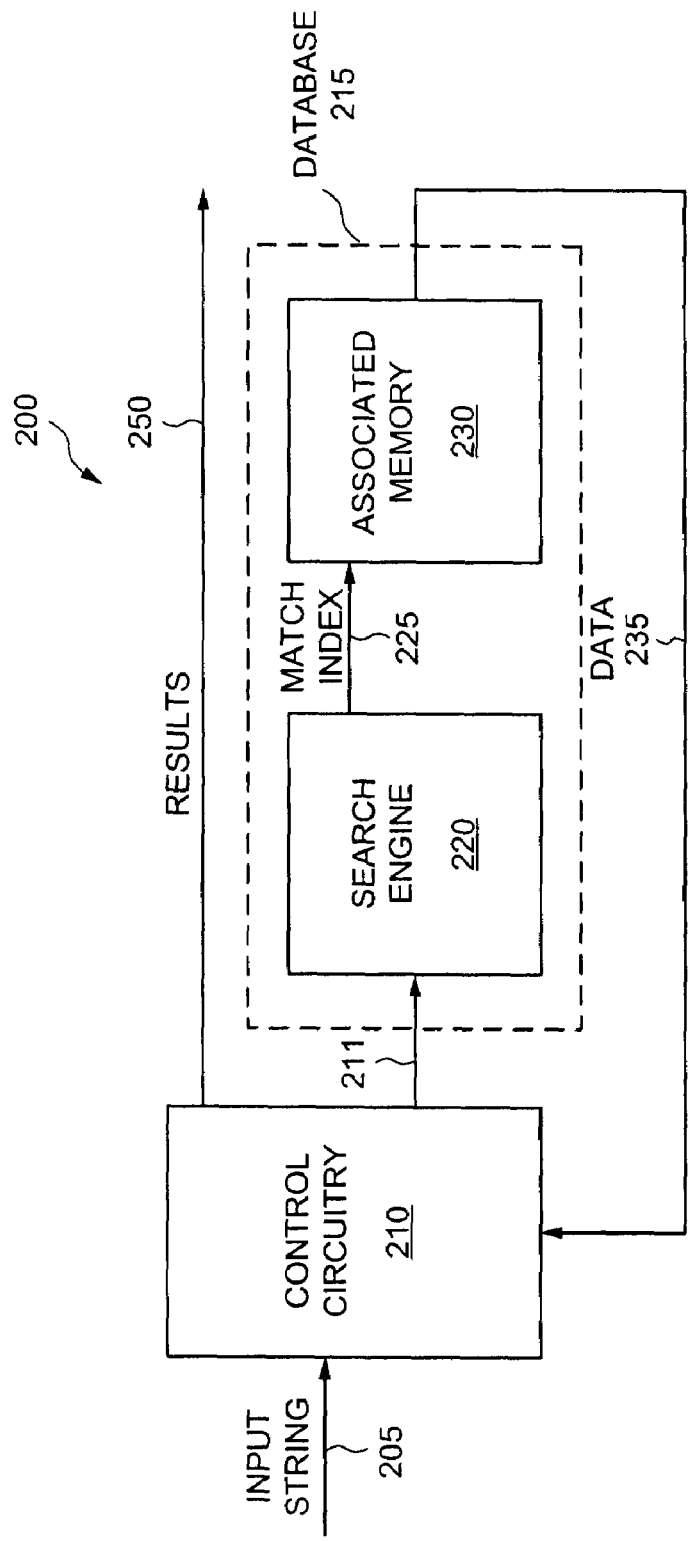
FIG. 2B illustrates one embodiment of the string search apparatus of FIG. 2A.

FIG. 2B illustrates one particular embodiment of string search apparatus 200 of FIG. 2A. In this embodiment, search string apparatus 200 includes control circuitry 210, search engine 220 and associated memory 230 that together operate as a state machine. Search engine 220 and associated memory 230 together form one embodiment of pattern and state database 215 of FIG. 1.

Search engine 220 implements the string search function using a state transition scheme. The state transition information is collectively stored in the pattern and state database 215. Patterns are encoded in the search engine as a series of entries. In one embodiment, each entry in the search engine 220 is a concatenated word that includes one character of the pattern and the corresponding state information. The control circuit 210 forms the search key (i.e., comparand) by concatenating one character from the input text with the current state information. The current state may be a null or idle state at power on. The control circuit 210 presents this concatenated search key to the search engine, which then searches through its entries. If there is a match, search engine 220 outputs a match index 225 that uniquely identifies the matching location in the search engine. If there are multiple matches, then the index corresponding to the highest priority is presented as index 225. Associated memory 230 receives the match index and returns data 235 stored therein. Associated memory 230 stores next state information and may store other information such as results and actions to be taken.

When associated memory 230 returns the next state information, the next state information is written to the current state register or variable, and a new search may be performed of on the database stored in search engine 220. The above process repeats until an action is indicated by data 235 that halts the process. The control circuitry 210 may keep track of an offset that indicates the number of character positions that are offset from the starting character of the input text string 205 for which a matching pattern in the pattern and state database 215 is found and output the same to the processor 100 as results 250.

In one particular embodiment, search engine 220 implements the Aho-Corasick algorithm. Alternatively, the scheme described herein may also be used to implement any large state machine involving a large number of states that may not be practical to implement by conventional means.

In one particular embodiment, associated memory 230 may be a random access memory (RAM) such as a static RAM (SRAM) or dynamic RAM (DRAM). In another embodiment, associated memory 230 may be a flash memory. Alternatively, another memory device, for example, a read only memory (ROM), such as an erasable programmable ROM (EPROM) or EEPROM may be used for memory 230.

In one embodiment, the search engine 220 comprises a ternary CAM (TCAM). Although discussed below in relation to a TCAM, in alternative embodiments, search engine 220 may be another type of search engine, for example, a hash based search engine or a trie based search engine. In one particular embodiment, a NSE5512 or NSE5526 ternary CAM available from NetLogic Microsystems, Inc. may be used for search engine 220. Alternatively, other search devices from NetLogic Microsystems, Inc. or from other vendors may be used.

Figure 3A:
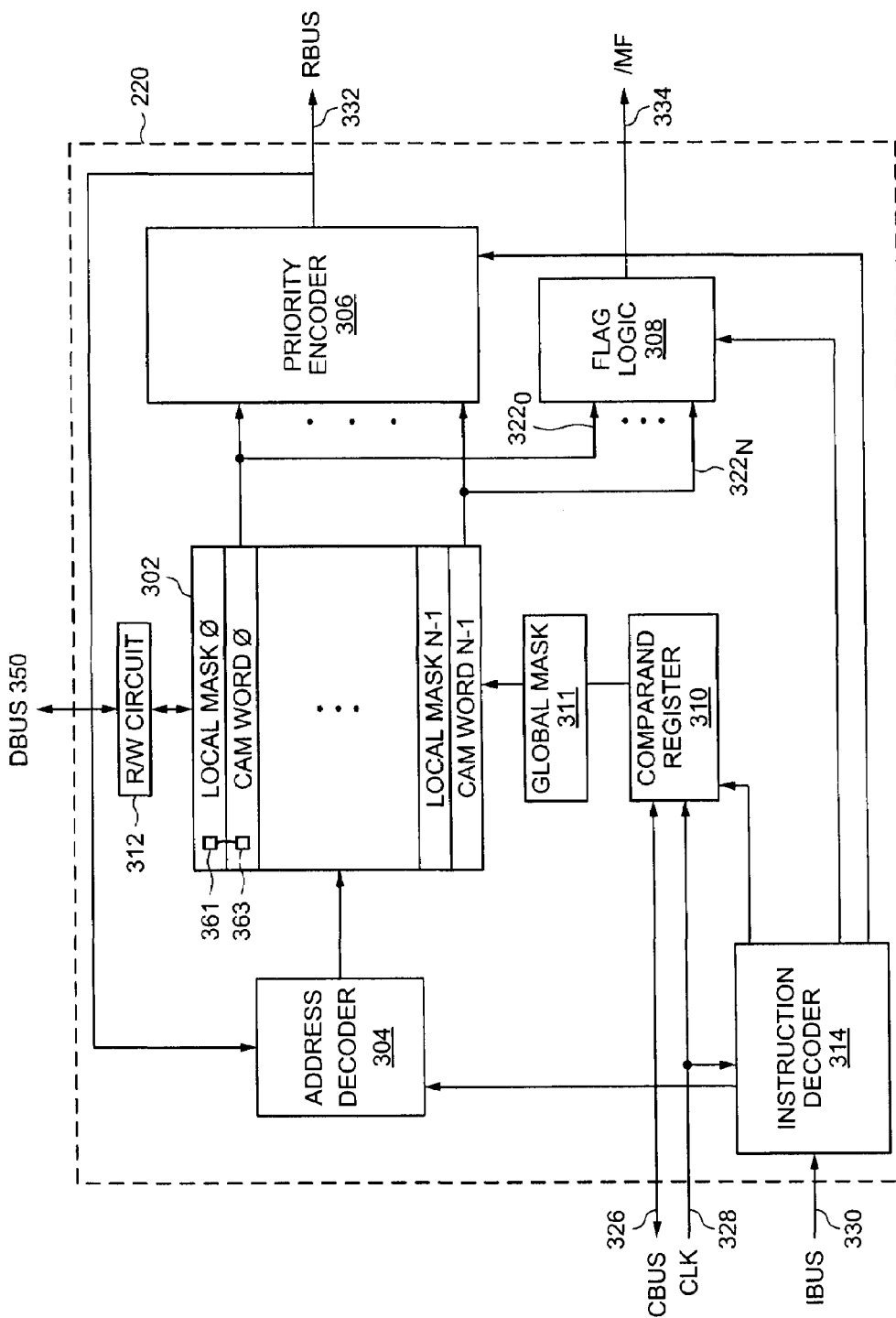
FIG. 3A illustrates one embodiment of a ternary CAM.

FIG. 3A illustrates one embodiment of a ternary CAM although other embodiments may be used. Ternary CAM 220 includes ternary CAM array 302, address decoder 304, priority encoder 306, flag logic 308, comparand register 310, instruction decoder 314, read/write circuit 312, and one or more global mask registers 311.

Ternary CAM array 302 includes rows of CAM cells for storing pattern data, and corresponding rows of mask cells for storing mask data. The ternary CAM array 302 can effectively store three states of information, namely: a logic one state, a logic zero state, and a "don't care" state for search or compare operations. The CAM array 302 cells may be any types of CAM cells including, for example, NAND and NOR based cells that may be formed from either volatile or non-volatile elements. Each CAM cell includes at least one memory storage element and at least one compare circuit. Other embodiments may be used to effectively implement an array 302 of CAM cells.

CAM words 0 to N−1 are each capable of storing a set of bits that may be received by comparand bus CBUS 326. CBUS 326 may be configured to receive search key 211 of FIG. 2B. Data may be read from or written to TCAM array 302 over data bus DBUS 350 by read/write (R/W) circuit 312 that includes one or more sense amplifiers and one or more write drivers. Each CAM word 0 to N−1 is coupled to a match line $322_0$ to $322_N$, respectively. The match lines indicate whether comparand data matched data stored in CAM words 0 to N−1. Match lines $322_0$ to $322_N$ are provided to flag logic 308 which generates a match flag signal /MF on line 334 indicating whether a match has occurred. Additional flags such as a multiple match flag may also be generated by flag logic 308. Flag logic 308 may also be incorporated into priority encoder 306. Match lines $322_0$ to $322_N$ are also coupled to priority encoder 306. If one of the match lines indicates a match between the search key and data stored at a corresponding location in TCAM array 302 (as masked by its local mask if set), priority encoder 306 outputs an index (e.g., an address) on RBUS 332 that uniquely identifies the location of the matching location in TCAM array 302. If more than one match is detected on match lines $322_0$ to $322_N$, priority encoder outputs the index associated with the highest priority entry in TCAM array 302. The highest priority entry may be located at the lowest physical address in TCAM array 302, at the highest physical address in TCAM array 302, or may use any other predetermined priority resolution scheme including operating on priority values explicitly stored with entries in TCAM array 302. Each CAM word 0 to N−1 has an associated local mask word 0 to N−1 that stores mask data for the CAM word. In contrast to global mask registers that mask entire columns of CAM cells, the local mask words include local mask cells 361 that mask individual CAM cells 363 of a corresponding CAM word on a bit-by-bit basis. The local mask cells may include memory cells for storing mask data. Each local mask word may include as many local mask cells 361 as there are corresponding CAM cells 363. For an alternative embodiment, there may be only as many local mask cells 361 as are required for masking corresponding CAM cells 363. For example, there may be less local mask cells 361 than CAM cells 363 if each of the CAM cell 363 will need not need to be masked. For alternative embodiments, the CAM words and local mask words may be encoded together to implement a ternary or quaternary function (storing effectively four states; namely, a 0, 1, always match or always mismatch state).

One or more global masking circuits (e.g., global mask 311) may be coupled between comparand register 310 and TCAM array 302 to mask entire columns in the TCAM array 302. It should be noted that TCAM 220 may include fewer components (e.g., comparand register may be omitted) or additional components than those shown in FIG. 3A. As ternary CAMs are known in the art, a more detailed transistor level description is not provided.

Figure 3B:
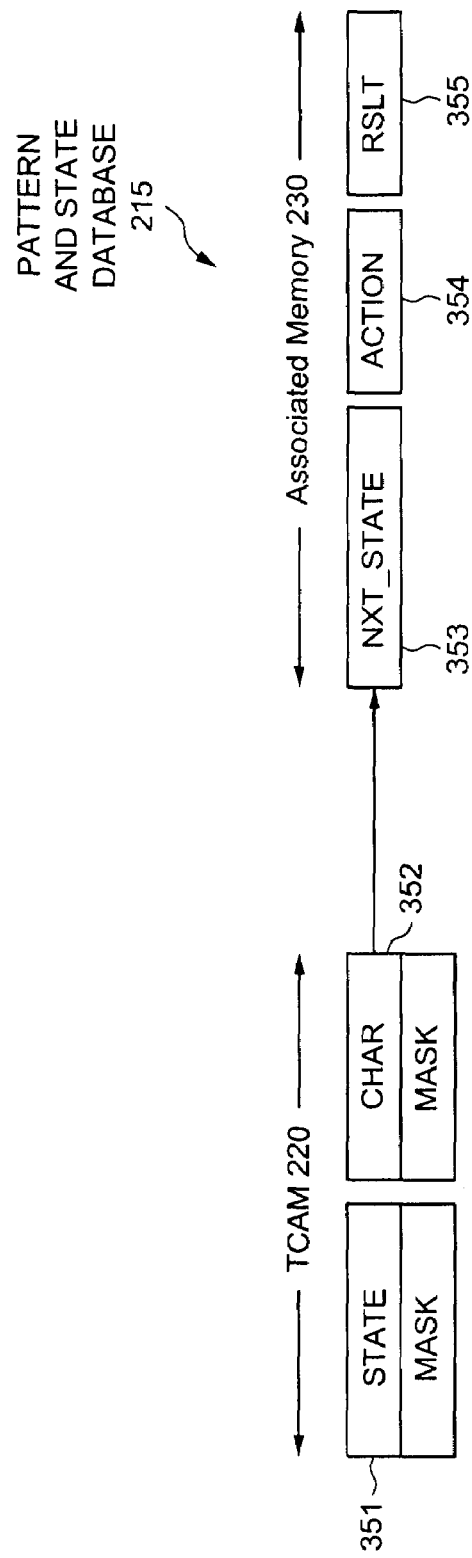
FIG. 3B illustrates one embodiment of fields of a ternary CAM and an associate memory.

FIG. 3B illustrates one embodiment of fields that can be stored in one or more rows of TCAM cells of search engine 220, and one embodiment of fields that can be stored in one or more rows of memory cells in associated memory 230. In this embodiment, the TCAM fields include a state (STATE) field 351, a pattern character (CHAR) field 352, and the associated memory 230 fields include a next state (NXT_STATE) field 353, an action (ACTION) field 354, and a result (RSLT) field 355. The state field 351 and the character field 352 together identify a state transition. The size (e.g., the number of bits) allotted to fields 351 and 352 depends on the maximum number of states expected in the pattern and state database 215. The next state field 353 uniquely identifies the next state for a given comparand that matches a corresponding state and character in fields 351 and 352, respectively. The action field 354 contains an opcode that provides control information to control circuitry 210 indicating the action to be taken by string search apparatus 200. In one embodiment, for example, the action field may be 3 bit encoded with: a 000 value indicating no action, advance to next character (NOP); a 001 value indicating emit result stored in the result field and advance to the next character in the input text string; and a 010 value indicating a failure with no advancement to the next character in the input text string. The size (e.g., the number of bits) allotted to field 354 depends on the maximum number of actions expected for the pattern and state database 215. The result field 355 contains a result code to be output from database 215 depending on the action. The size (e.g., the number of bits) allotted to field 355 depends on the maximum number of patterns in the pattern and state database 215.

In one particular embodiment, TCAM search engine 220 implements an Aho-Corasick (AC) algorithm. The AC algorithm uses finite state automata, also known as a state machine. Several methods for handling state transitions may be used when implementing the AC algorithm. In one embodiment, the method is a goto-failure method that achieves a reduction in the number of state transitions at the expense of lower throughput. In a given state, if any of the expected characters in any of the patterns is received, then the state machine goes to the next state. When the next character is not one of the expected characters, a failure link is taken to the state representing the longest prefix possible with the current state.

Goto-Failure Method

Figure 4A:
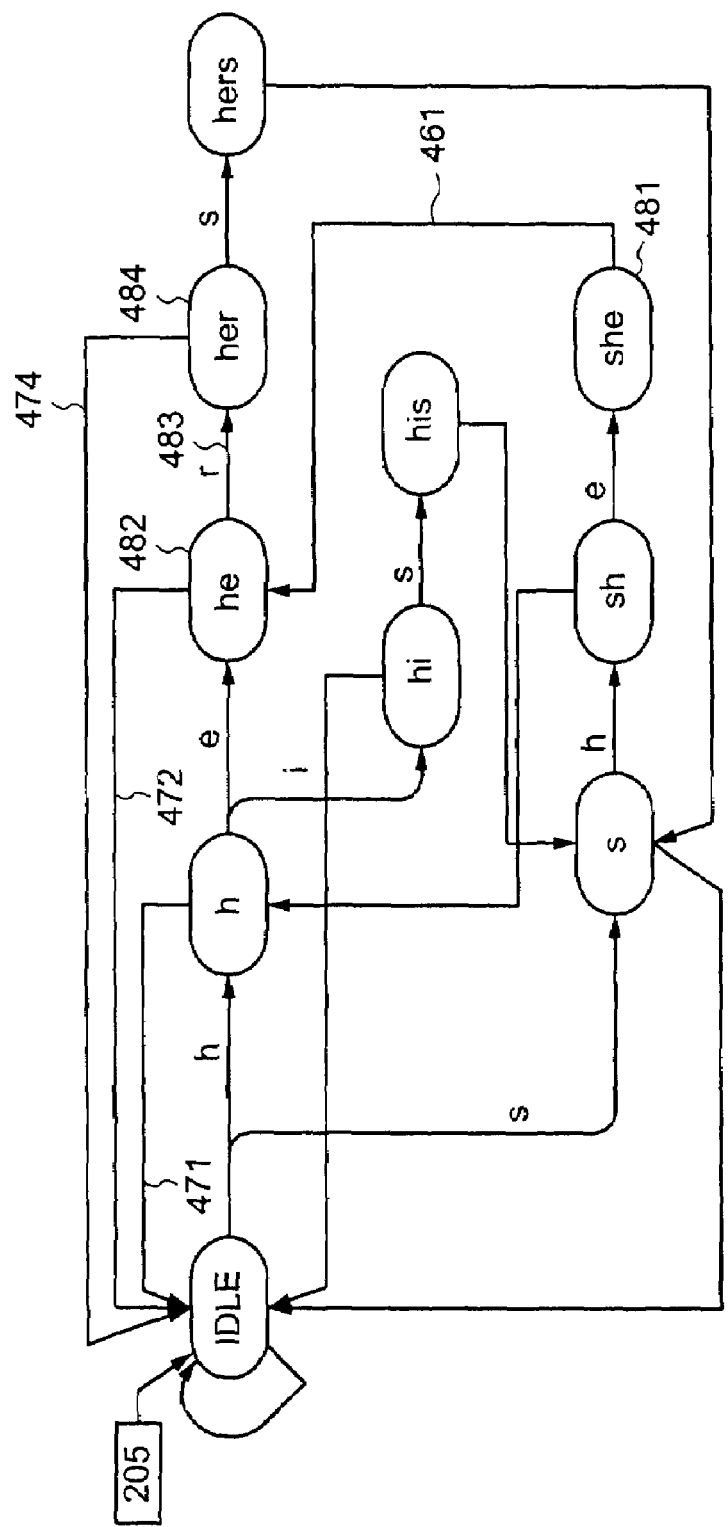
FIG. 4A is a state transition flowchart illustrating one embodiment of goto-failure method using an exemplary set of patterns.

FIG. 4A is a state transition flow chart illustrating the goto and failure method for handling state transitions using an exemplary set of patterns {he, she, his, hers}. A "goto" transition transitions to a new state while advancing to the next character in the input text. A "failure" transition advances to a new state, but does not advance to the next character in the input text. Consider the state "she" 481. If the character "r" is received, the logical next state should be "her." However, the failure transition 461 jumps to state "he" 482 and once this state is reached, the character "r" 483 is considered again to make the correct state transition to "her" state 484.

The goto-failure method may be implemented using two tables to encode state-to-state transitions. The first table is a "goto" table that gives the next state value if a current character matches the expected character for this state. If there is no match in the first "goto" table, then the second table is used, which is a "failure" table that gives the state transition (a failure transition) if any other character is received. A failure transition may take the state back to the "idle" state in some cases. However, the next character can also take it to a state corresponding to a different pattern. Failure transitions reduce the throughput because the string search apparatus 200 advances to the next character only on a "goto" transition.

This goto-failure method may be implemented in TCAM search engine 220 and associated memory 230 by, for example, dividing TCAM search engine 220 into two blocks, as illustrated in FIG. 4B. The states in the tables of FIG. 4B may be identified with a unique descriptive string associated with the state for ease of discussion. In an actual implementation of the tables in TCAM search engine 220 and associated memory 230, each state is represented by a corresponding unique number.

All the goto transitions of the first table may be placed in a first goto block 491 with a higher priority (e.g., at a lower address). Each goto transition translates to one entry in the TCAM search engine 220 and one entry in associated memory 230. Within the goto block 491, the relative placement of the different transitions may not be important because only one of the entries in this block will match. All the failure transitions of the second table may be in a second block, failure block 492, following the first goto block 491. The relative position of the failure block means that its entries have a lower priority compared to the entries in goto block 491. The entries in the failure block 492 will match only if there was no match in the goto block 491.

In one embodiment, the goto-failure method may be optimized by compressing the entries in the blocks, as illustrated in FIG. 4C below. In this embodiment, all failure transitions to the state IDLE (e.g., as shown by the four failure transition IDLE states 471-474 of FIG. 4B) are captured by a single entry 475, for example, at the lowest priority entry of TCAM search engine 220 that has all the entries masked (represented by the * in the state field 351 and character field 352) and, therefore, will always result in a match.

The goto-failure method requires two look-ups for one incoming character in case the failure transition is taken, thereby resulting in reduced search speed. In an alternative embodiment, a deterministic method may be used that eliminates failure transitions. In this embodiment, state transitions may be increased with the string search apparatus 200 making explicit transition from each state for each character.

Deterministic Method

Figure 5:
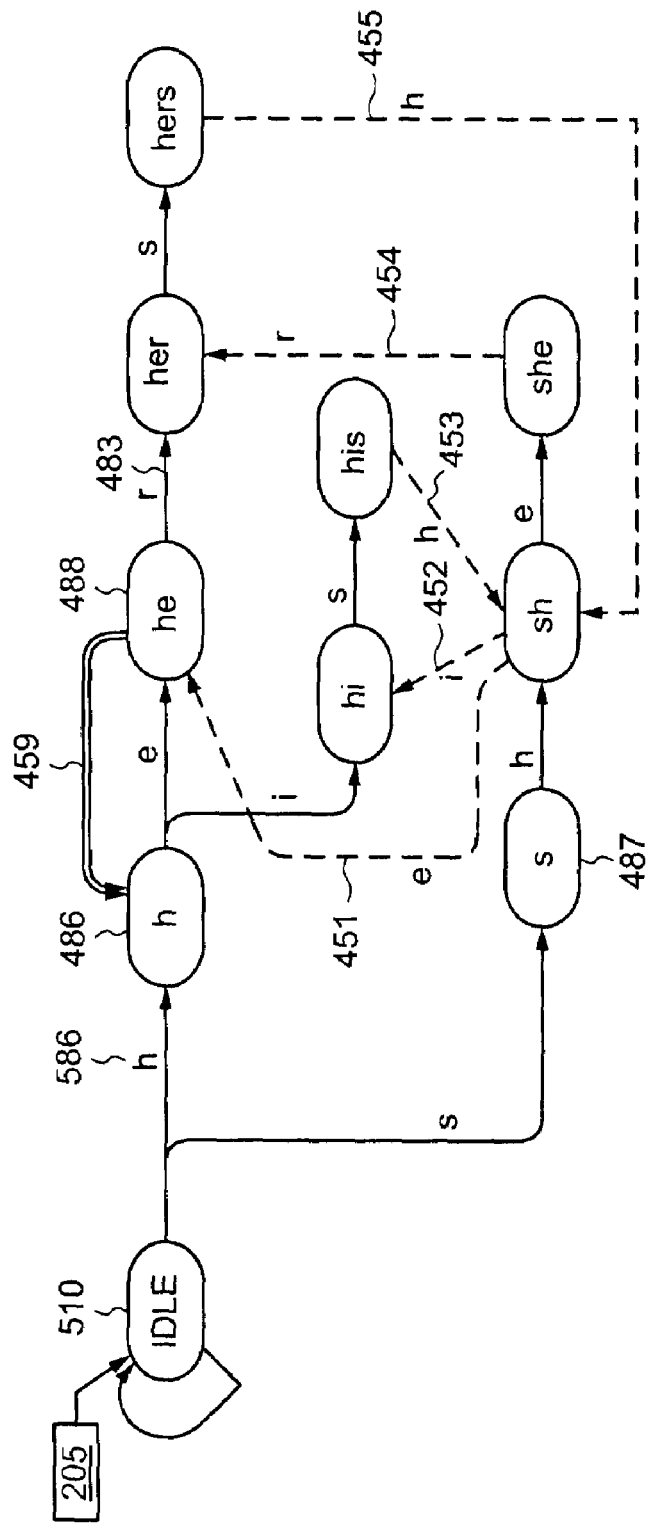
FIG. 5 is a state transition flowchart illustrating one embodiment of a deterministic method for handling state transitions using the same exemplary set of patterns of FIG. 4A.

FIG. 5 is an exemplary state transition diagram illustrating a deterministic method for handling state transitions using the same exemplary set of patterns of FIG. 4A. The deterministic method described below achieves a higher speed than the goto-failure method described above, but at the cost of extra transitions. In this embodiment, in each state, only one transition leads to the valid next state. This method is deterministic, since each character results in one lookup. The transitions shown in FIG. 5 with the dashed lines are the new transitions over the state transitions of the goto-failure method shown in FIG. 4A. In addition, for the sake of clarity, the transitions from any state to the "idle" state 510 and the transitions back to state "h" 486 and state "s" 487 are not shown. The deterministic implementation adds additional transitions shown with the dashed lines 451-455 to the goto block 491 of FIG. 4B. It should be noted that not all transitions are shown for clarity. As an example consider the character "h" 586 is received in any state including the idle state 510, the state should transition to the state "h" 486 if "h" is not a regular transition. One such state transition 459 is marked with double line arrow going from state "he" 488 back to state "h" 486 upon receiving the character "h" 586. The rest of such transitions, although required, are not shown for clarity. A brute force implementation in one embodiment would have one TCAM search engine 220 entry (and associated memory entry 230) for each of the transitions. The implementation of such a brute force embodiment will end up with 31 entries for the example shown. The use of the ternary feature of TCAM search engine 220 lends itself to a very good compression of the entries. The entries can be reduced, for example, by dividing the entries in to three blocks as illustrated in FIG. 6.

Figure 6:
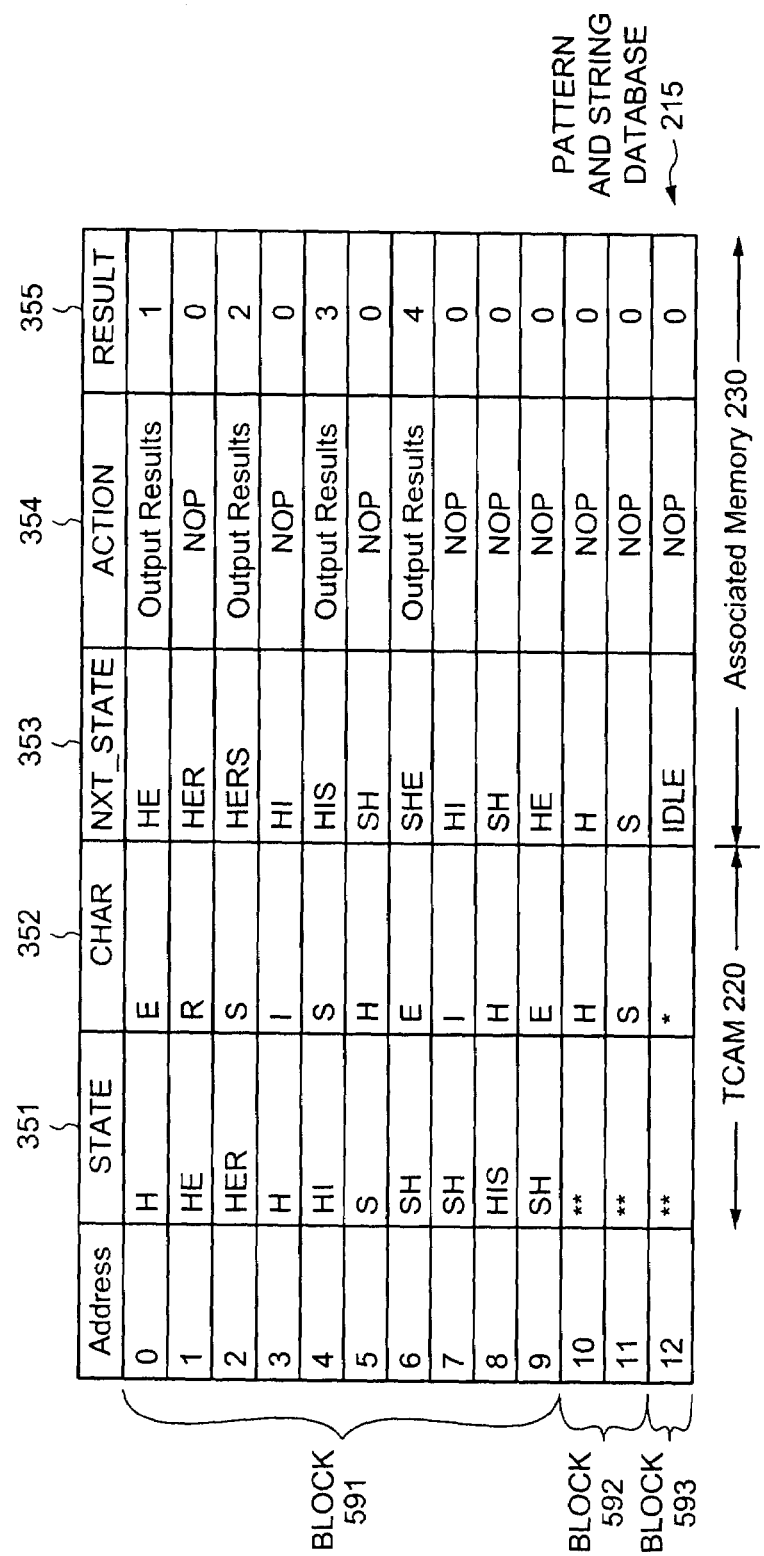
FIG. 6 illustrates an exemplary contents of one embodiment of a database implementing the deterministic method of state transitions of FIG. 5.

FIG. 6 illustrates an exemplary structure of one embodiment of a pattern and state database implementing a deterministic method of state transitions. Pattern and state database 215 may be divided into three blocks: "block 1" 591, "block 2" 592 and "block 3" 593. These blocks correspond to the relative position of a state in the state transition diagram FIG. 5. The block 593 with the lowest priority corresponds to the state "idle". This is the default entry that always goes back to idle state 510, if there are no other matches. In such an embodiment, all transitions to idle state 510 can be achieved with the single last entry of block 593. This entry will have all its fields masked (as indicated by the * in the state field 351 and the character field 352) and, hence, will always match resulting in a transition to the IDLE state 510.

All transitions corresponding to the states immediately following the "idle" state 510, such as the state "h" 486 and state "s" 487, are implemented using block 592 containing entries with the next higher priority. These entries have the STATE field 351 masked out (as indicated by the * in this field). These entries will also take care of a transition from any state to the next state shown, such as the transition 459 shown by the double line arrow. All other transitions go in the highest priority block 591.

Case Insensitive Matching

Figure 7:
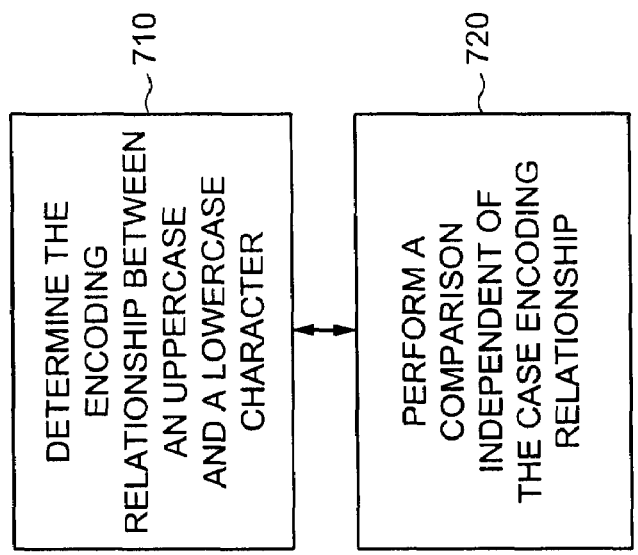
FIG. 7 is a flow chart illustrating one embodiment of a case insensitive search method.

FIG. 7 is a flow chart illustrating one embodiment of a case insensitive search method. In this embodiment, the method for handling state transitions accommodates case insensitive matching. As an example of a case insensitive match, the pattern "she" should match "she" or "SHE". Alternatively, case insensitive matching may be required on certain portions of the pattern. As an example, "she" should match "She" but not "SHE" in a case where case insensitive matching is only used for "s" and "S". The case insensitive search method includes determining an encoding relationship between an upper case character and a lower case character at 710. Then, at 720, a comparison of the input text string 205 with patterns stored in pattern and state database 215 is performed that is independent of the case encoding relationship.

FIG. 7A shows the American Standard Code for Information Interchange (ASCII) format encoding 730, which is one possible encoding for characters. In one embodiment, the characters of incoming text string 205 may be encoded in the seven bit ASCII format. A study of this format reveals that there is a fixed relation between the encoding of lower case and upper case characters. For example the lowercase character "a" is encoded in binary as 110 0001 (i.e., row 6=110 and column 1=0001). The upper case "A" is encoded as 100 0001. These two differ in bit position 5. This is true for all other alphabet characters as well. If bit-5 can be masked out during a compare operation, case insensitive matching can be achieved. This rule applies to all the alphabetic characters. As already described, each position in a ternary CAM can be set to a "don't care". In order to achieve the case insensitive matching for the text and patterns in the ASCII encoding example, bit-5 can be locally set to a "don't care" in all the patterns in the database where case insensitive matching is desired. The case insensitive matching can also be achieved for all the patterns in the pattern and state database, for example, by setting a global mask such that bit-5 is masked. In other example, extensions to the ASCII set such as the 8-bit ISO8859 may also be used.

Figures 7B, 7C:
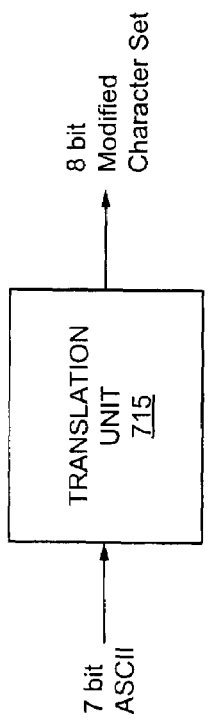
FIG. 7B shows one embodiment of a translation unit.
FIG. 7C shows one embodiment of the character set after translation.

Using the seven bit ASCII character set and masking bit-5 may, however, have an undesired side effect with respect certain special characters such as "[" that are also encoded in rows-4 and 5 along with the alphanumeric characters. If case insensitive matching is desired globally and so global masks are used and special characters 731 are used as part of pattern database, then incorrect operation may result since a character such as "[" will match both the characters "[" as well as "{". An alternative embodiment, a translation unit may be used to translate the 7-bit incoming ASCII characters to 8-bit outgoing characters as shown in FIGS. 7B and 7C. The special characters now appear in other unused rows in an expanded 8-bit table. While using one extra bit, this scheme allows case insensitive matching without any constraints. This is made possible because of the extra code space that is available in an 8-bit space. The translation scheme should be applied to all the patterns stored in the database as well as to the incoming text characters before they are used in any compare operations. The scheme shown in FIG. 7C is exemplary and any similar translation scheme can be used to achieve the same end. For one embodiment, 7-bit to 8-bit translation can be performed by translation unit 715 that may be included within pattern and state database 215. Translation unit 715 can be, for example, a lookup table, combinatorial logic, and any form of software or hardware that performs the necessary translation.

Wildcard Matching

Figure 8A:
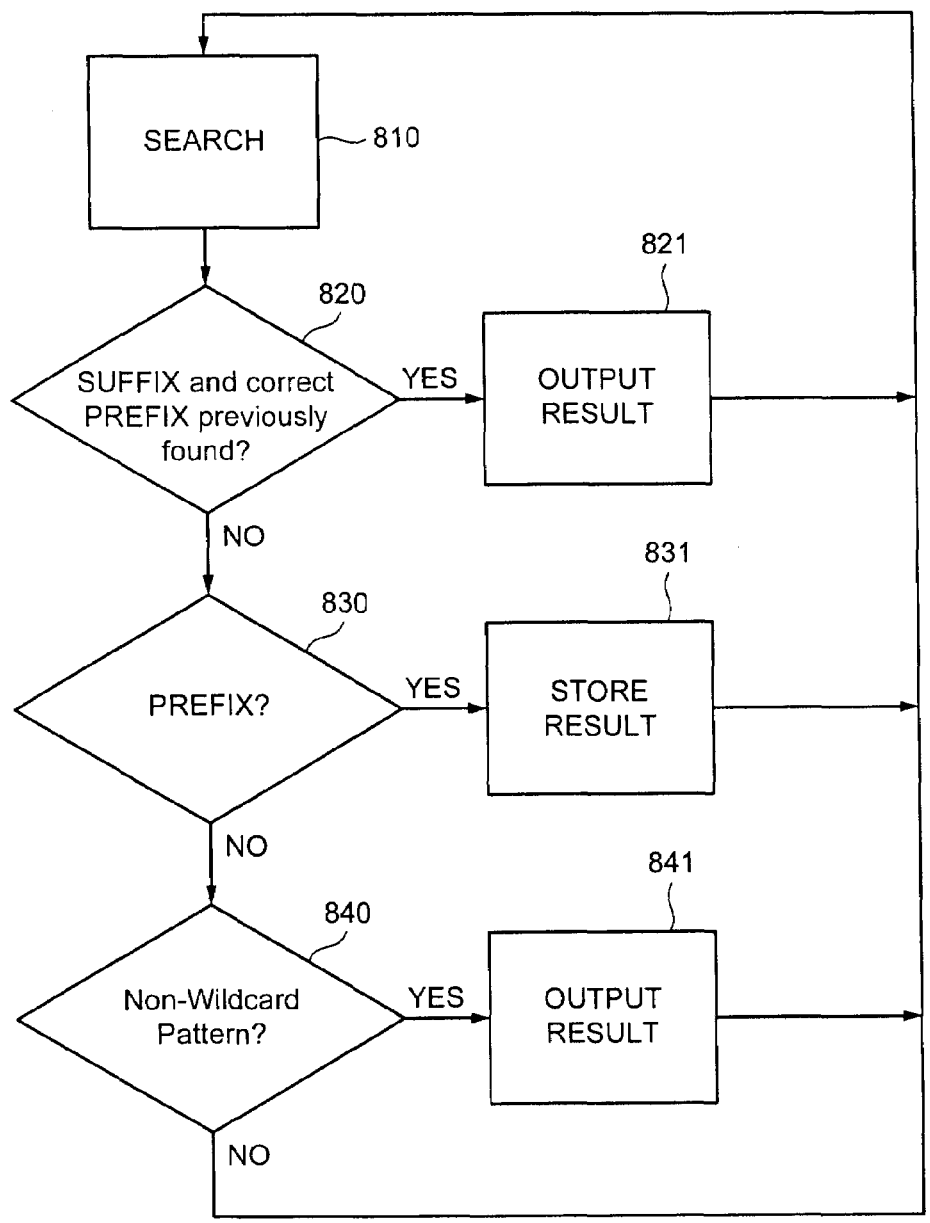
FIG. 8A is a flow chart illustrating one embodiment of a method of wildcard matching.

FIG. 8A is a flow chart illustrating one embodiment of a method of performing wildcard matching using state and pattern database 215. In such an embodiment, a search may be performed for patterns matching an input text string 205 having one or more of the characters unspecified. When a wildcard match is performed, the input text string 205 containing the wildcard may be conceptually split into, for example, two sub-patterns. The first sub-pattern contains the portion of the input string preceding the wildcard, called the prefix. The second sub-pattern contains the portion of the input text string 205 succeeding the wildcard, called the suffix. Wildcard matching is used to look for any pattern matching the given prefix and the suffix of the input text string 205. As mentioned, the wildcard may comprise more than one unspecified character. In other words, there can be any number of intervening characters (including zero) between the prefix and the suffix. Consider, for example, the pattern "T#BLE." "T" is the prefix, "BLE" is the suffix, and "#" represents the arbitrary number of unspecified intervening characters. The following patterns will match the above wildcard pattern: "TABLE," "TROUBLE," "TREMBLE," and "TUMBLE."

FIG. 8A illustrates an exemplary flow diagram for wildcard matching. At 810, input information from the input string is searched against the stored patterns in the state and pattern database 215. At 820, a suffix is located and the process determines that a prefix corresponding to this suffix was previously found, a wildcard match has been located and a result indicating the match is output at 821. If, at 830 however, a prefix is found, then at 831 the result code corresponding to the prefix is output from the pattern and state database 215 and is stored (e.g., in the CUR_PREFIX 881 register shown in FIG. 8B). If, however, a non-wildcard match is found at 840, a result indicating this match is output at 841 and the process returns to 810. If no matches are located in the pattern and state database, the process performs 810 again with the next character from input text.

Figure 8B:
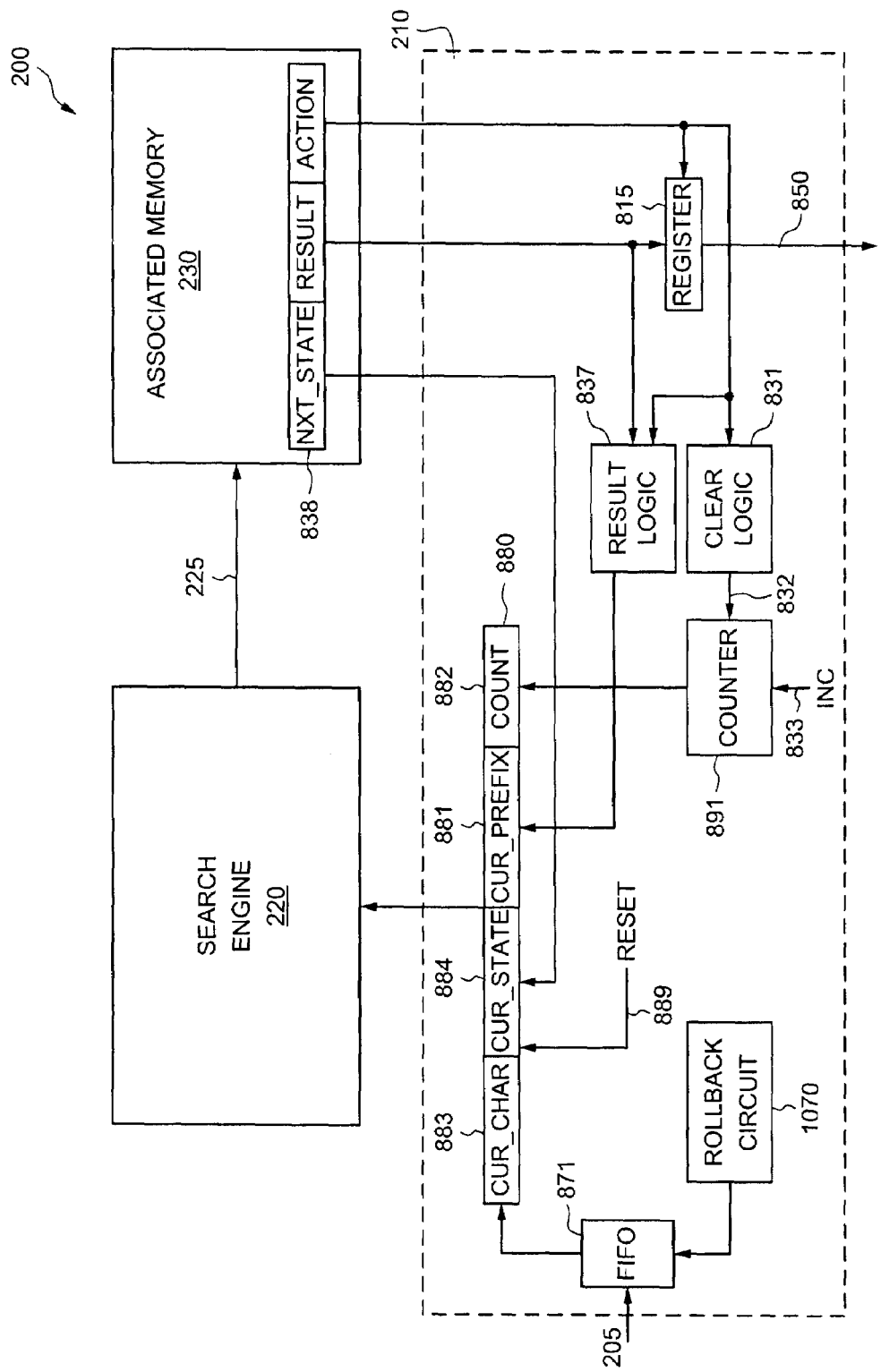
FIG. 8B illustrates one embodiment of a search string apparatus illustrating components implementing wildcard matching.

FIG. 8B illustrates one embodiment of a string search apparatus that is capable of performing wildcard matches. In this embodiment, control circuitry 210 includes First-In-First-Out (FIFO) storage circuit 871, state registers 880, counter 891, clear logic 831, result logic 837 and register 815. For other embodiments, roll back circuitry 1070 may also be included.

FIFO storage circuit 871 is configured to receive characters of input text string 205, and outputs the characters to CUR_CHAR register 883 of state registers 880. In alternative embodiments, FIFO storage circuit 871 may be omitted and the input text string provided directly to CUR_CHAR register 883 or to a translation unit (e.g., translation unit 715 of FIG. 7B).

State registers 880 include multiple registers containing various information used to perform a lookup in the ternary CAM array 302. For example, in the embodiment implementing wildcard matching, state registers 880 include current character (CUR_CHAR) register 883, a current state (CUR_STATE) register 884, a current prefix (CUR_PREFIX) register 881, and a count register 882. Alternatively, state registers 880 may be a single register having multiple register bit position groups corresponding to registers 881-884.

State registers 880 provide the search key for TCAM search engine 220. TCAM search engine 220 looks for the occurrence of one or more patterns stored in CAM array 302 that match the information in state registers 880. If a match is found then a search result is presented to associated memory 230 as a match index 225 corresponding to the matching location in the TCAM array 302. The match index 225 is used as the address 231 for a look-up of associated memory 230. Associated memory 230 stores additional data such as the next state, result, and action. An example of an entry in associated memory 230 is shown as entry 838. Associated memory 230 is coupled to control circuitry 210 to transmit the next state, action and result code data to the control circuitry 210.

Associated memory 230 may be coupled to register 815 of control circuitry 210. As discussed above in regards to FIG. 8A, if a result is to be output at 821 and 841 in TCAM search engine 220, the result from the RESULT field of the corresponding entry in associated memory 230 is output for storage in register 815. For one embodiment, one or bits of the action field of a given entry in associated memory 230 can be used to control loading into register 815. This result may then be output from the apparatus 200 (e.g., to a processor such as processor 100).

The NXT_STATE field of entry 838 in associated memory 230 is coupled to current state register 884, such that the next state information corresponding to the match index 225 is loaded into current state register 884.

The action and result code data from entry 838 are coupled to result logic circuit 837 that loads the RESULT data from associated memory 230 into the CUR_PREFIX register 881 when a valid prefix result is encountered in a search of TCAM search engine 220.

The ACTION code is also provided to clear logic 831, for example, to assert a clear signal 832 that sets counter 891 to zero when a prefix in the text string 205 is detected after a search on TCAM search engine 220. For one embodiment, the action field may be 3 bits ($A_2, A_1, A_0$) encoded as follows: a 000 value indicating no action, advance to next character (NOP); a 001 value indicating emit result in the RESULT field; and a 010 value indicating a failure with no advancement to the next character. It should be noted again that the action field of associated memory 230 illustrated in FIG. 8B is only exemplary and the other action field codes/sizes and corresponding logic circuit configurations may be used.

Counter 891 is also coupled to receive an increment (INC) signal 833 that increments counter 891 for every new character received by control circuitry 210. The operation of count register 882 and counter 891 is discussed in more detail below in relation to FIG. 8D. State registers 880 are also coupled to receive a power-on reset (RESET) signal 889 that loads an idle state in current state register 884.

It should also be noted that control circuitry 210 may not necessarily contain all the components illustrated in FIG. 8B depending on what database search features may be supported by string search apparatus 200. For example, in an embodiment that does not implement wildcard searching, control circuitry 210 may not include clear logic 831, counter 891 and/or result logic 837. It should be also be noted that, alternatively, one or more of the component functions shown in the control circuitry of FIG. 8B may be implemented within hardware or firmware of processor 100.

Consider the following example of the operation of apparatus 200 to locate a wildcard match in an input text string using FIGS. 8A-8C. FIG. 8C illustrates an exemplary embodiment of TCAM search engine entries and associated memory entries that may be used in conjunction with the embodiment of control circuitry 210 shown in FIG. 8B to store and search for the wildcard pattern "T#BLE". Assume, for example, that string search apparatus 200 is in an idle state and receives a first character "T" from input string 205. The IDLE state is currently loaded in CUR_STATE register 884 and the "T" is loaded into CUR_CHAR register 883 and these contents are compared with the entries stored in TCAM search engine 220. A match is detected at address zero with the prefix "T", and the NXT_STATE of IDLE is read from a corresponding entry in associated memory 230 and loaded into CUR_STATE register 884. Additionally, the RESULT value of "101" and an ACTION value of "UPDATE CUR_PREFIX" are read from the corresponding entry in associated memory 230. In response to the action "UPDATE CUR_PREFIX", result logic 837 loads the RESULT value of "101" into CUR_PREFIX register 881. Now assume that one or more characters other than "B" are received from the input string text 205 and loaded into CUR_CHAR register 883. In each case, the TCAM search engine will be searched and no match will be found. When a "B" is received from input string 205, it is loaded into CUR_CHAR register 883 and the contents of registers 883, 884 and 881 ("IDLE", "B", and "101", respectively) are compared with fields 351, 352 and 856, respectively, in each of the entries stored in TCAM search engine 220. A match is detected at address one, and the NXT_STATE of "B" is read from a corresponding entry in associated memory 230 and loaded into CUR_STATE register 884. Additionally, the RESULT value of "0" and an ACTION value of "NOP" are read from the corresponding entry in associated memory 230. In response to the action "NOP", result logic 837 does not update the contents of CUR_PREFIX register 881. If the next character received from input text string 205 is an "L", a match is detected at address two, the NXT_STATE of "BL" is loaded into CUR_STATE register 884, and the CUR_PREFIX register 881 is not updated. If the following character received is "E", a match is detected at address three, the NXT_STATE of "IDLE" is loaded into CUR_STATE register 884, the RESULT value of "102" and an ACTION value of "OUTPUT WILDCARD MATCH" are read from the corresponding entry in associated memory 230. In response to the action "OUTPUT WILDCARD MATCH", a wildcard match has been located because the suffix "BLE" was found and the suffix "T" was previously found as indicated by match between the value "101" stored in CUR_PREFIX register 881 and the value stored in field 856. The result 102 is loaded into register 815 and can be output from string search apparatus 200.

FIG. 8D illustrates an alternative embodiment of a wildcard matching method with a fixed number of wildcard characters. In this embodiment, a fixed number of wildcard characters are searched for rather than an unbounded number of intervening characters in a wildcard match. As an example, consider the pattern "T??BLE" where each "?" represents a single wildcard character. "TUMBLE" will match the pattern while "TROUBLE" and "TABLE" will not match because of the incorrect number of intervening characters between the prefix "T" and the suffix "BLE". When the prefix is detected, in addition to storing the result in the previous result register 881, the control circuitry 210 maintains a count of the characters in the input text string 205 after a prefix match. This may be implemented, for example, using an internal counter 891. Internal counter 891 is set to zero when a prefix match is detected and, for every new character received, counter 891 is incremented by one. The count in counter 891 is also stored in COUNT register 882 and compared, along with the contents of registers 883, 884, and 881, with the entries in TCAM search engine 220, which also include a COUNT field 857. When a suffix pattern is detected, the values in the previous result field 856 as well as the count field 857 must match the corresponding values in the presented comparand in order for the wildcard pattern to be matched. As can be seen from FIG. 8D, when the suffix "BLE" is detected (indicated by the address 3, current state 351 entry of "BL" and the current character 352 entry "E"), if the input text string 205 was "TUMBLE" then the count in address 3 count field 857 is 5, thereby resulting in a match because after "T" is detected there are exactly five characters received including the suffix characters "BLE". In the case of "TREMBLE," then there would be three characters "REM" between "T" and "BLE" generating a count of 6. Such a count of 6 will not result in a match.

FIG. 8E illustrates an alternative embodiment of a wildcard matching method for identifying nested patterns. For example, assume two wildcard patterns "S#BLE" and "T#BLE", and an input text input string of "STABLE". "TABLE" is nested within "STABLE". As shown in FIG. 8E, different result codes can be used to identify different prefixes (or suffixes) to accommodate nested wildcard patterns. For example, a first result code of "101" can be used for identifying the detection of the prefix "S", a second result code of "102" can be used for identifying the detection of the prefix "T". Additionally, two different result codes can be used to identify when a first wildcard is detected and a second wildcard match is detected. For example, result code "103" can be used to identify when "T#BLE" is detected, and result code "104" can be used to identify when "S#BLE" is detected. In an alternative embodiment, the wildcard matching method can be enhanced to detect multiple nested wildcard patterns by having multiple CUR_PREFIX registers in the control circuitry and also having multiple PREV_RSLT fields in the TCAM search engine database 220. Additionally, the nested method can be extended for fixed number nested wildcard matching.

Parallel Matching

Figure 9A:
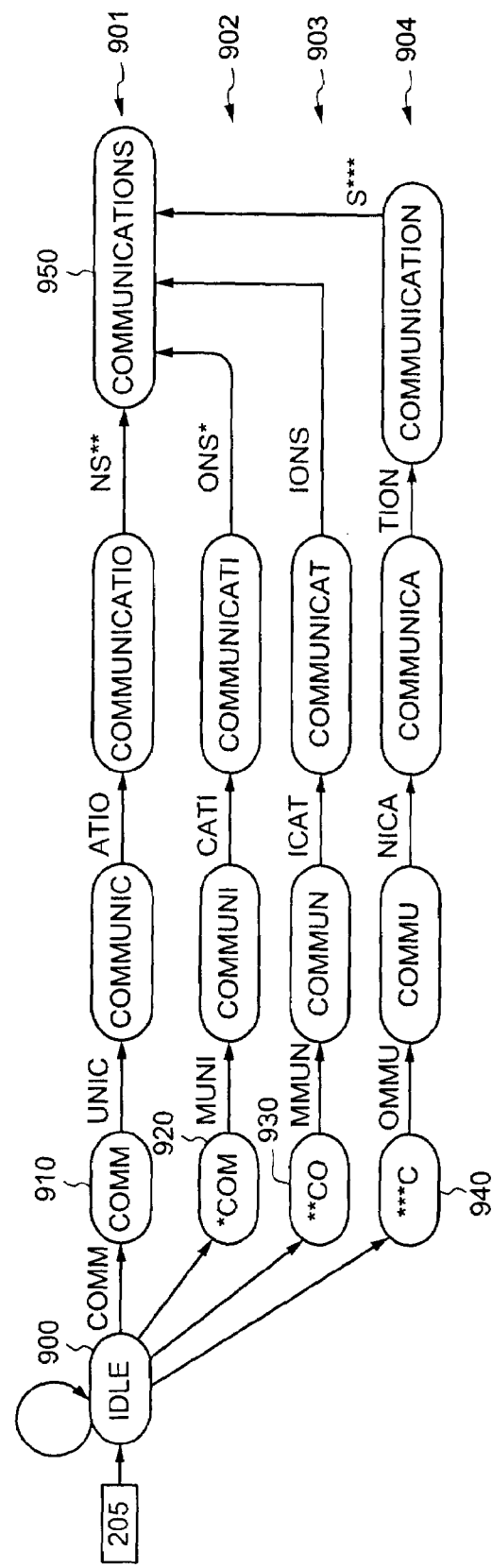
FIG. 9A is a state diagram illustrating a parallel matching method using an exemplary set of patterns.

The methods described above are capable of very high speed searching. FIG. 9A illustrates an embodiment of a parallel matching method capable of increased search speeds.

Figure 9B:
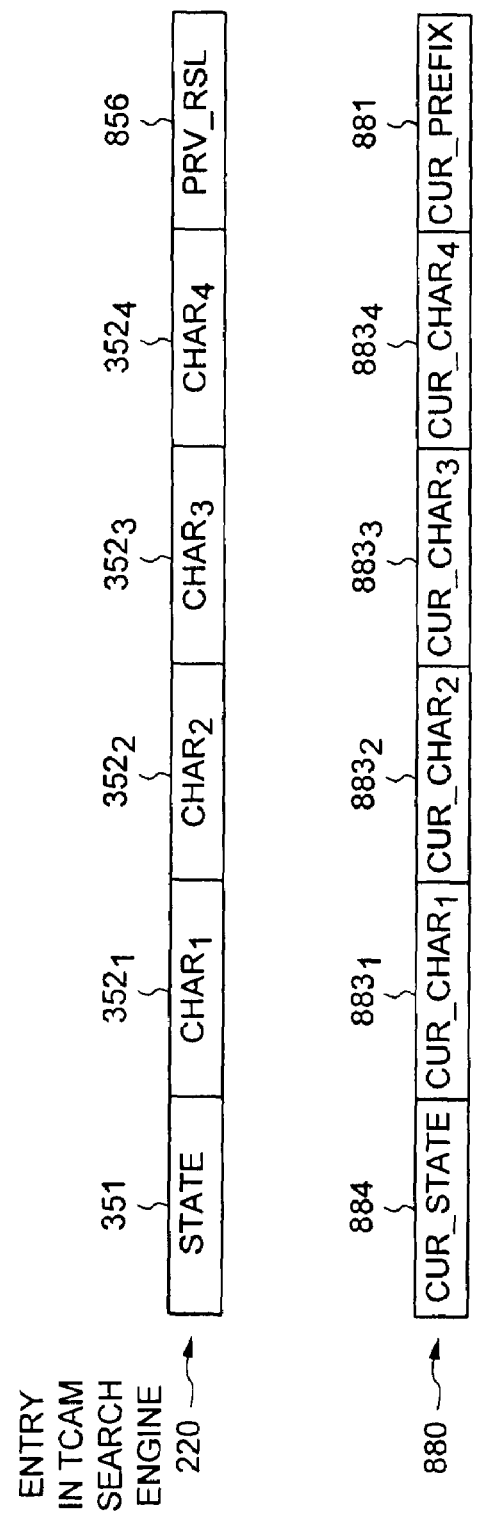
FIG. 9B illustrates exemplary fields in an entry in a TCAM and exemplary registers in control circuitry.

In one embodiment, the speed of the matching method may be increased by increasing the number of input characters that are compared at a time from the current one character to multiple characters. The one character at a time method considered so far achieves unanchored pattern matching. In going from one character at a time matching to multiple character matching, the main problem to be solved is how to achieve unanchored searching. This section describes how to achieve an N fold increase in search speed by considering N characters from the input text at a time. FIG. 9A illustrates an example of how to achieve 4× speedup by comparing 4 characters at a time. Consider the text "OPTICAL COMMUNICATIONS" and further consider that we are looking for the pattern "COMMUNICATIONS". When a set of 4 characters is presented to the string search apparatus, the start of the pattern within the text may be offset 0, 1, 2 or 3 characters within this four character group. In one embodiment, all four such possibilities are represented in the pattern and state database with the first, second, third and fourth state entries being offset by 0, 1, 2 and 3 characters, respectively. The string search apparatus 200 considers all four entries in the database, COMM 910, *COM 920, CO 930 and *C 940, in order to achieve an unanchored match (where the "*" denotes that the corresponding character in the database is masked out). Each of the states follows a separate branch path 901-904 through the state machine until the result state 950 is reached. By following the same search procedure for multiple patterns, the parallel matching method achieves un-anchored multiple string matching. The parallel matching method may be implemented in hardware by increasing the width of the state register 880, and correspondingly, increasing the width of the entries in TCAM search engine 220, by a size corresponding to a size of the number of input characters (N) that are desired to be compared at a time. For example, as illustrated in FIG. 9B, if four characters will be processed at one time, then four CUR_CHAR registers $883_1$-$883_4$ may be used and, correspondingly, four CHAR fields $352_1$-$352_4$ may be used in each entry of TCAM search engine 220.

FIG. 9C shows an exemplary implementation of the parallel matching scheme. The TCAM and associate memory space is divided into four blocks $960_1$-$960_4$. The relative placement of the entries within a given block does not affect the operation. Block $960_4$ is the lowest priority block (e.g., has the highest addresses) and contains the default entry to IDLE state. This entry will match when nothing else has matched. Block $960_3$ is the next higher priority block and contains all transitions to the first level states after IDLE (i.e., states 910, 920, 930, and 940). All these entries have their STATE masked. This serves both the transitions from IDLE to the first level states as well as transitions from any other state to the first level states. Block $960_2$ is the next higher priority block and contains all the entries where a result is output. The characters at the end that are not part of the pattern are masked out. The next state is the IDLE state. Block $960_1$ is the highest priority block and contains all other entries. When a pattern is detected, the end of that pattern may take all four or only a part of the block of four characters. In this case, a possibility exists that the remaining characters may be the start of a new pattern. Hence, all the combinations of the end of the current pattern and start of all new patterns need to be included. For example, the entry at address 5 has a CHARS state of "ONSC". The first three characters "ONS" complete the current pattern and the result is output. The last character "C" may be start of a new pattern and hence the new state is "C".

The input text should be presented to the search apparatus in multiples of the set size (e.g., 4 characters as discussed above). When the last set of characters in the text string are presented, it may not be equal to the full set size. In this case, the remainder of the characters in the set can be set to an unused character that does not occur in any of the patterns in the database.

Rollback

In FIGS. 9A-9C, a large number of entries in the TCAM search engine 220 may be used for combinations of one pattern followed immediately by a second pattern. These entries can be eliminated and fewer entries needed in the TCAM search engine 220 through the use of a rollback method and apparatus described below. For one embodiment, FIFO storage circuit 871 can be used to store several incoming characters of the incoming text, and a read pointer of FIFO 871 can be used to selectively read out the desired characters stored in FIFO 871. A group of characters can be read from FIFO 871 and loaded into the corresponding CUR_CHAR registers. If, for example, the first two read characters match the end of a current pattern, the remaining characters can be effectively ignored for this pass through the TCAM search engine 220. The remaining characters, however, remain stored in FIFO 871, and the read pointer of FIFO 871 can be rolled back or selectively set to point to access the remaining characters as part of a new search. Associated memory 230 may include one extra field per entry called the ROLLBACK field that identifies the number of characters that should be pushed or rolled back in FIFO 871. The rollback mechanism also allows further optimization by merging several branches of the state machine in to one.

Figure 10A:
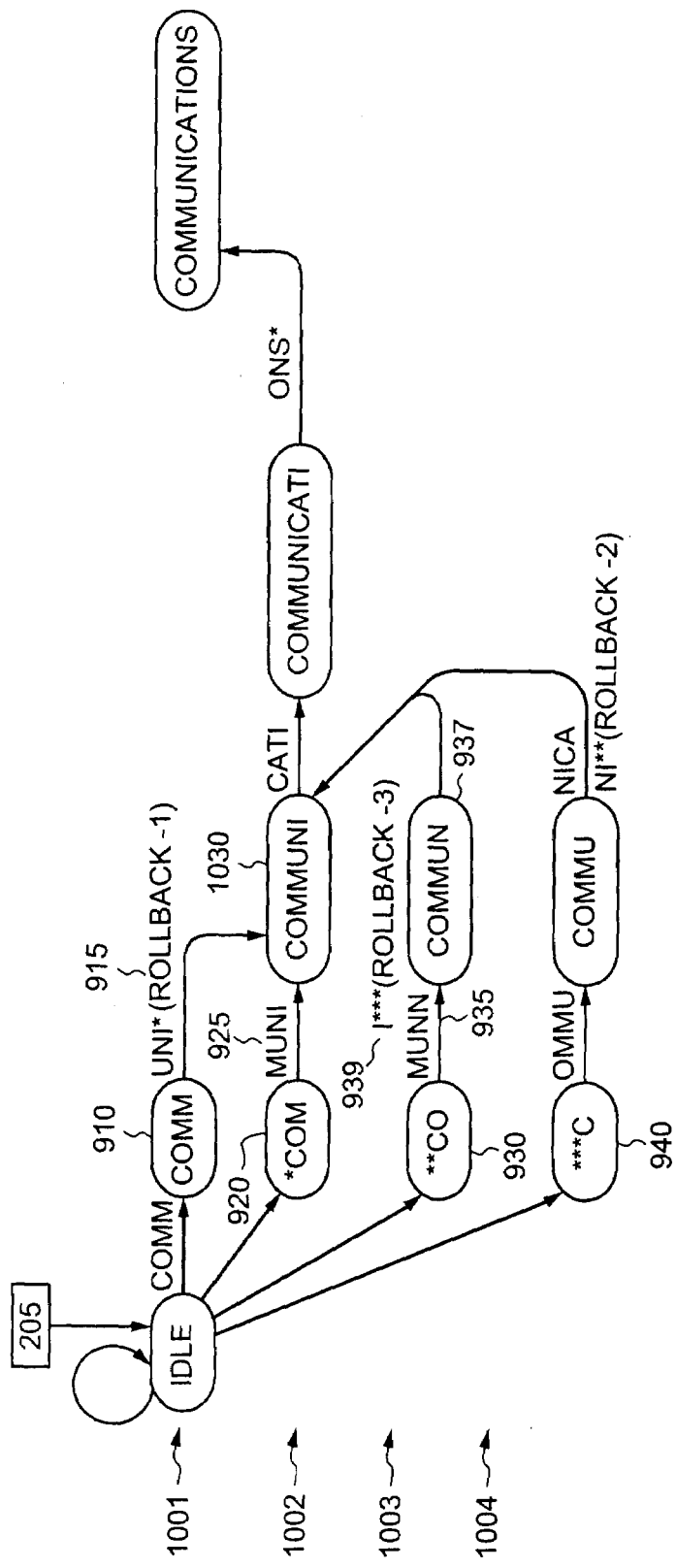
FIG. 10A is a state diagram illustrating a rollback method for handling state transitions using the exemplary pattern set of FIG. 9A.

FIG. 10A is a state diagram illustrating a rollback method for handling state transitions using the exemplary patterns of FIG. 9A. In this exemplary embodiment, for a given pattern, once the first N (e.g., four) characters are matched to a current state, then all the branches (e.g., branches 1001-1004) of the state machine converge to a single common lowest next state (e.g., state 1030) that is common to all the state transitions. In this process, if some of the current states have already progressed to more characters in the pattern than the others, these are then rolled back as shown in FIG. 10A.

In the exemplary state diagram of FIG. 10A, the pattern "COMMUNICATIONS" in the text string 205 is taken four characters at a time and exists as four branches of state transitions in the database 215 with the first, second, third and fourth branches being offset by 0, 1, 2 and 3 characters, respectively. The string search apparatus 200 considers all four possible entries COMM 910, *COM 920, CO 930 and *C 940. If the next four characters received in the input string 205 are "MUNI" 925, then the state machine transitions current state 920 to the *COMMUNI" next state 1030. If the next four characters received in the input string 205 are "UNI*" 915, then the state machine, which in the embodiment of FIG. 9A would have gone to the state "COMMU-NIC", instead rolls back the state to "COMMUNI" state 1030, even though the "COMMUNI*" state transition branch 1001 had progressed to more characters (e.g., 8 characters) than the "*COMMUNI" state transition branch 1002 (e.g., having 7 characters).

As another example, consider the state COMMUN 937. If the next four characters received in the input string 205 is "I*" 939, the state machine rolls back to "COMMUNI" state 1030 (a common state to another state transition branches) even though the "COMMUNI**" state transition branch 1003 had progressed to more characters (e.g., 10 characters) than the "COMMUNI" state transition branch 1004 (e.g., having 7 characters).

Figure 10B:
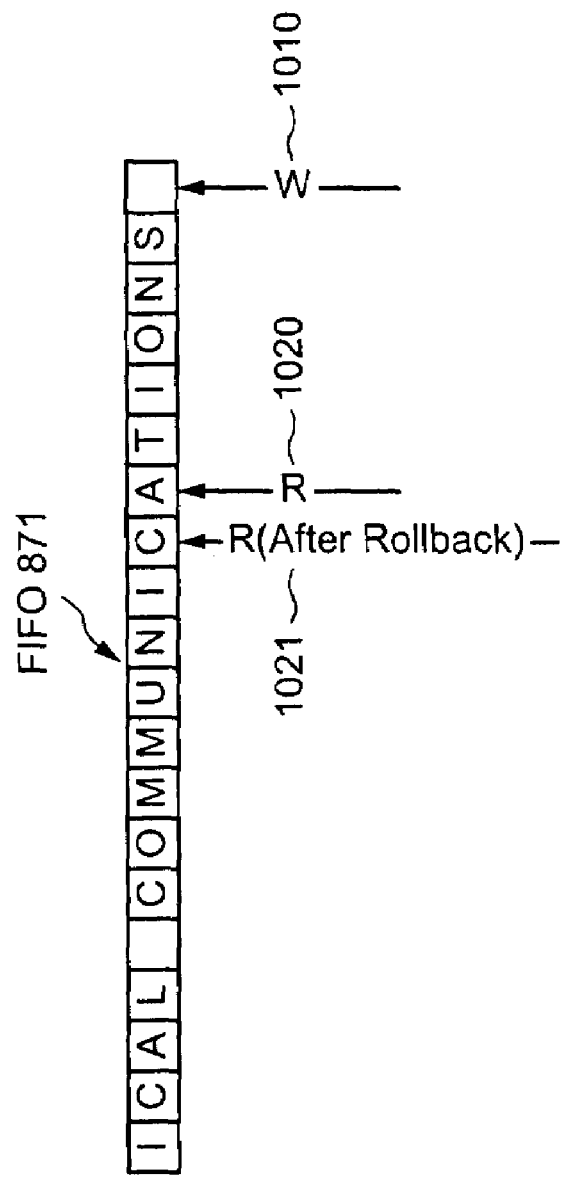
FIG. 10B illustrates entries that may be in a FIFO.

An embodiment of entries in FIFO 871 for the rollback method is shown in FIG. 10B. The case shown in FIG. 10B is from the state "COMM" 910 and when the input text "UNIC" 915 is received. Once these four characters are read, the read pointer points to the next valid character in the FIFO, which is character "A". Due to the rollback mechanism, the state diagram transitions to the state "COMMUNI" 1030, and the read pointer is rolled back to position 1021 to ensure that the next four characters read will be "CATI", and the input text 205 and the current state are in synchronization again. In one embodiment, using a circular buffer size of N, the write process stops writing when the FIFO count reaches N−3 to prevent overwriting the useful data that may be required in case a rollback takes place. The basic concept shown for a character-wide FIFO of FIG. 10B can be extended to the parallel implementation for increased speed.

Figure 10C:
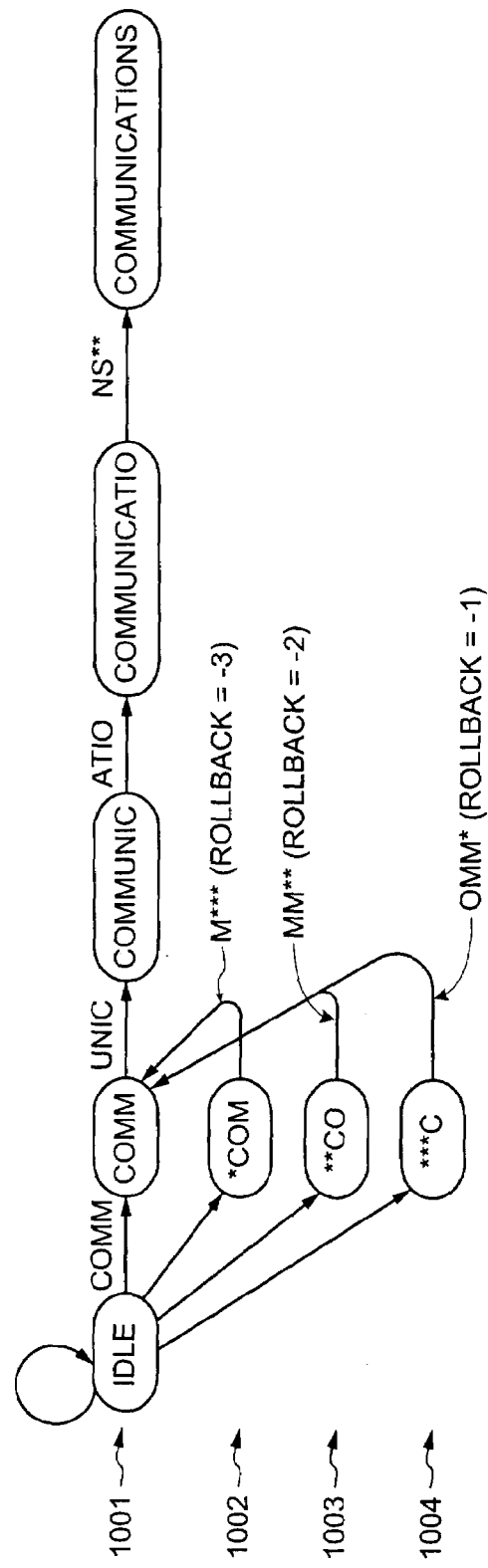
FIG. 10C is a state diagram illustrating a rollback method for handling state transitions using the exemplary pattern set of FIG. 9A.

FIG. 10C is a state diagram illustrating an alternative embodiment of rollback method for handling state transitions. In this embodiment, depending on the state, the rollback method processes some of the input text string 205 characters twice. The read pointer is adjusted (rolled back) only when there is a partial match in the text with one of the patterns stored in database 215. The probability of a rollback can be reduced if the algorithm looks for a longer match before resorting to the rollback. FIG. 1C illustrates an example where the string search apparatus 200 waits for a partial match of only 4 characters before starting the rollback.

Each entry in FIFO 871 may be wide enough (i.e., contain sufficient bits) to store one character at a time, or may be wide enough to store multiple characters at a time. For one example, each entry of FIFO 871 may be wide enough to store four characters in each entry.

In one embodiment, the rollback method discussed above with respect to FIGS. 10A-10C may be implemented in hardware by adding an extra field in the associated memory 230 and by adding rollback circuit 1070 (see FIG. 8B) in control circuitry 210. FIG. 10D illustrates an embodiment of the exemplary contents of a TCAM search engine 220 and associated memory 230 implementing a rollback method. This extra field is a ROLLBACK (ROLLBK) field that contains the count of characters that are rolled back in FIFO 871 before the start of a search.

FIG. 10D shows an exemplary implementation of the rollback scheme described in FIGS. 10A-10C. The TCAM and associate memory space is divided into three blocks $1030_1$-$1030_3$. Block $1030_3$ is the lowest priority block (e.g., has the highest addresses) and contains the default entry to transition to the IDLE state. Block $1030_2$ is the next higher priority block and contains all the entries having as their next state (the CHARS state), the state after the IDLE state (i.e., states 910, 920, 930 and 940). Block 10301 is the highest priority block and contains all other entries. Looking at field entries 1042, 1043, 1044, and 1045, it can be seen that all four rows have the same next state. In effect, three of the input string entries are rolled back to match the stored pattern with the shortest match.

Figure 11:
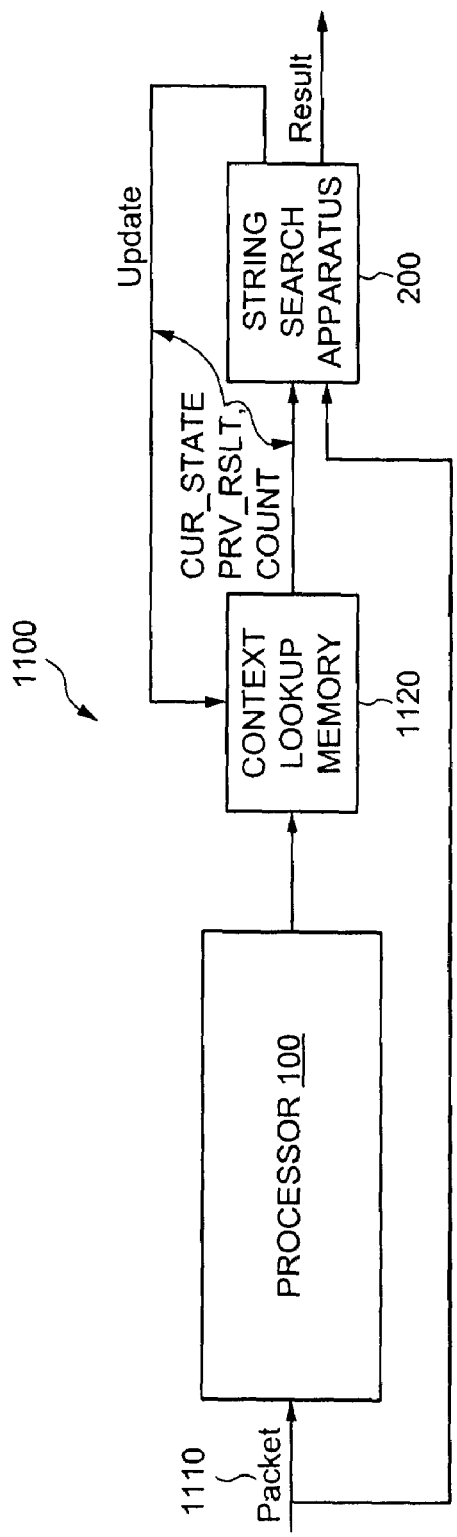
FIG. 11 is a conceptual illustration showing a string matching apparatus handling multiple flows.

FIG. 11 is a conceptual illustration showing a string search apparatus handling multiple flows or contexts. In many applications, there is a requirement to handle multiple contexts. In one embodiment, for example, the string search apparatus 200 may be used in a networking system to switch and/or route data between the network's transmission lines to transfer data payloads from a source to a destination. Data payloads are typically transmitted in the form of packets that are made up of smaller data cells. A packet is a unit of data that is routed between a source and a destination on a packet-switched network. Typically, a packet may travel through a number of network points having routers before arriving at its destination. When a data packet 1110 arrives at the input of router 1100, several lookups may be performed to determine the subsequent handling of packet 1110. Router 1100 may include processor 100 and a string search apparatus 200 to perform the various packet forwarding lookups. The packet 1110 may be parsed by processor 100 to get one or more keys (e.g., a header) in order to perform the various lookups.

Consider a typical Internet router employing the IPV4 based protocol system where multiple TCP/IP based connections exist. A single higher layer data payload may be split across multiple TCP packets. Multiple TCP connections may exist. Each TCP connection may generate multiple TCP packets. The TCP packets from different connections may be interleaved. Hence, when the TCP packets arrive at the string search apparatus, one choice is to re-assemble packets that belong to each TCP connection separately so that the text for a given connection is presented contiguously to the string search apparatus. However this method requires extra memory and also involves other overhead such as memory and protocol processing. An alternative embodiment considers each TCP connection as a separate context. When all the characters of a packet have been processed, it stores the current state or context of this connection. When a packet belonging to the same connection is received, then it restores the context and re-starts the search. In order to search through a higher-level data payload, the string search apparatus 200 switches between multiple contexts. This can be implemented as a simple table lookup (e.g., in memory 1120) to first fetch the context of the search. The context may include the parameters such as current prefix, result code, remainder of characters that could not be processed from the current packet, roll back value and count as discussed above. In case of parallel searching, for the example shown, a set of four characters is presented to the search apparatus. In case a packet is not a whole multiple of 4 characters long, a remainder number of characters, which may be up to 3 characters, may be left. These characters are saved as part of the context and combined with the next packet belonging to the same TCP connection. The mechanism of saving and restoring the context allows the string search apparatus to handle multiple streams of input text that are interleaved in packets.

It should be noted that the string matching methods and apparatus discussed herein may be used in a wide variety of applications, for examples, URL based switching, Web caching, XML parsing, intrusion detection systems, implementation of data compression (e.g., Limpel-Ziv), calculations of DNA sequencing, and others.

It should be noted that the circuitry associated with the operations of a particular "diagram block" as illustrated within a "diagram block" is done only for ease of discussion and that such circuitry may have other groupings or physical locations within an apparatus.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A string search apparatus for implementing search operations between an input string of characters and a plurality of signatures embodied by a state diagram having a plurality of branches of sequential states extending from a root node, wherein each state is associated with a goto transition to a next state and with a failure transition to a fail state, the string search apparatus including a database comprising:
   a ternary content addressable memory (TCAM) having a plurality of rows each for storing a first portion of a corresponding state entry of the state diagram; and
   an associated random access memory (RAM) having a plurality of rows each for storing a second portion of the corresponding state entry, wherein the first portion of each state entry includes a state field and a character field that are individually masked with respect to the first portions of other state entries, wherein the first portion of each state entry further includes a previous result field and a count field, and the second portion of each state entry includes a next state field and a result field.

2. The string search apparatus of claim 1, further including a control circuit coupled to the TCAM and to the associated RAM, the control circuit comprising:
   a state register having a current character field, a current state field, a current prefix field, and a count field;
   an input register for receiving the input string of characters, wherein the input register provides input characters to the current character field of the state register;
   a counter for providing a count value to the count field of the state register; and
   result logic for providing a result code to the current prefix field of the state register.

3. The string search apparatus of claim 1, wherein the character field of each TCAM state entry includes a number $N \geq 2$ of characters of the signatures.

4. The string search apparatus of claim 3, further including a control circuit coupled to the TCAM and to the associated RAM, the control circuit comprising:
   a state register having a current character field, a current state field, a current prefix field, and a count field, wherein the current character field stores N of the characters of the input string.

5. The string search apparatus of claim 4, wherein the state register provides a search key comprising the N current characters, a current state, a current prefix, and a count value to the TCAM for a compare operation with the first portions of the state entries stored in the TCAM.

6. The string search apparatus of claim 4, wherein the control circuit further comprises:
   an input register coupled to the state register and configured to receive the input string of characters;
   a counter for providing a count value to the count field of the state register; and
   result logic for providing a result code to the current prefix field of the state register.

7. The string search apparatus of claim 6, wherein the control circuit further comprises:
   a rollback circuit coupled to the input register, wherein the rollback circuit stores a rollback value that controls a read pointer of the input register.

8. A string search apparatus for implementing search operations between an input string of characters and a plurality of signatures embodied by a state diagram having a plurality of branches of sequential states extending from a root node, wherein each state is associated with a goto transition to a next state and with a failure transition to a fail state, the string search apparatus including a database comprising:
   a ternary content addressable memory (TCAM) having a plurality of rows each for storing a first portion of a corresponding state entry of the state diagram; and
   an associated random access memory (RAM) having a plurality of rows each for storing a second portion of the corresponding state entry, wherein the first portion of each state entry includes a state field and a character field that are individually masked with respect to the first portions of other state entries, wherein all failure transitions to the root node are represented by a single state entry stored in the database.

9. The string search apparatus of claim 2, wherein the state field and the character field of the single state entry consist of ternary don't care bits.

10. The string search apparatus of claim 8, wherein the character field of each state entry that represents a failure transition to a non-root state consists of ternary don't care bits.

11. A string search apparatus for implementing search operations between an input string of characters and a plurality of signatures embodied by a state diagram having a plurality of branches of sequential states extending from a root node, wherein each state is associated with a goto transition to a next state and with a failure transition to a fail state, the string search apparatus including a database comprising:

a ternary content addressable memory (TCAM) having a plurality of rows each for storing a first portion of a corresponding state entry of the state diagram; and associated random access memory (RAM) having a plurality of rows each for storing a second portion of the corresponding state entry, wherein the first portion of each state entry includes a state field and a character field that are individually masked with respect to the first portions of other state entries, wherein all the goto transitions to a second state immediately adjacent to the root node are represented by a single state entry stored in the database.

12. The string search apparatus of claim 5, wherein the state field of the single state entry consists of ternary don't care bits.

13. A string search apparatus for implementing search operations between an input string of characters and a plurality of signatures embodied by a state diagram having a plurality of branches of sequential states extending from a root node, wherein each state is associated with a goto transition to a next state and with a failure transition to a fail state, the string search apparatus comprising:

a ternary content addressable memory (TCAM) having a plurality of rows each for storing a first portion of a corresponding state entry of the state diagram, wherein the first portion of each state entry includes a state field and a character field that are individually masked with respect to the first portions of other state entries;

an associated random access memory (RAM) having a plurality of rows each for storing a second portion of the corresponding state entry, wherein the second portion of each state entry includes a next state field and a result field; and a control circuit coupled to the TCAM and the associated RAM, wherein the control circuit is configured to provide multiple characters of the input string to the TCAM during a search operation according to the state diagram stored in the TCAM and the associated RAM, wherein the control circuit comprises:

a state register including a current character field and a current state field, wherein the state field of at least one TCAM state entry stores a number $N \geq 2$ of characters of a corresponding goto transition, and the current state field of the state register stores N characters of the input string; and a current prefix field.

14. The string search apparatus of claim 13, wherein the state register provides a search key comprising N characters of the input string concatenated with a current state value to the TCAM for the search operation.

15. The string search apparatus of claim 13, wherein the control circuit further comprises:

an input register to receive the input string of characters and configured to provide the input characters to the current character field of the state register;

result logic configured to provide a result code received from the associated RAM to the current prefix field of the state register; and a rollback circuit coupled to the input register, wherein the rollback circuit stores a rollback value that controls a read pointer of the input register.

16. The string search apparatus of claim 13, wherein all failure transitions to the root node are represented by a single state entry stored in the TCAM.

17. The string search apparatus of claim 16, wherein the state field and the character field of the single state entry consist of ternary don't care bits.

18. The string search apparatus of claim 13, wherein the character field of each state entry that represents a failure transition to a non-root state consists of ternary don't care bits.

19. The string search apparatus of claim 13, wherein all the goto transitions to a second state immediately adjacent to the root node are represented by a single state entry stored in the TCAM.

20. The string search apparatus of claim 19, wherein the state field of the single state entry consists of ternary don't care bits.

21. A string search apparatus for implementing search operations between an input string of characters and a plurality of signatures embodied by a state diagram having a plurality of branches of sequential states extending from a root node, wherein each state is associated with a goto transition to a next state and with a failure transition to a fail state, the string search apparatus including a database comprising:

a ternary content addressable memory (TCAM) having a plurality of rows each for storing a first portion of a corresponding state entry of the state diagram, wherein the first portion of each state entry includes a state field and a character field that are individually masked with respect to the first portions of other state entries;

an associated random access memory (RAM) having a plurality of rows each for storing a second portion of the corresponding state entry, wherein the second portion of each state entry includes a next state field and a result field; and a control circuit coupled to the TCAM and the associated SRAM, wherein the control circuit comprises:

a state register having a current character field, a current state field, a current prefix field, and a count field;

an input register for receiving the input string of characters, wherein the input register provides input characters to the current character field of the state register;

a counter for providing a count value to the count field of the state register;

result logic for providing a result code to the current prefix field of the state register.

22. The string search apparatus of claim 21 wherein the control circuit further comprises:

a rollback circuit coupled to the input register, wherein the rollback circuit stores a rollback value that controls a read pointer of the input register.

23. The string search apparatus of claim 21, wherein all failure transitions to the root node are represented by a single state entry stored in the database.

24. The string search apparatus of claim 23, wherein the state field and the character field of the single state entry consist of ternary don't care bits.

25. The string search apparatus of claim 21, wherein the character field of each state entry that represents a failure transition to a non-root state consists of ternary don't care bits.

26. The string search apparatus of claim 21, wherein all the goto transitions to a second state immediately adjacent to the root node are represented by a single state entry stored in the database.

27. The string search apparatus of claim 26, wherein the state field of the single state entry consists of ternary don't care bits.

* * * * *